United States Patent
Shin et al.

(10) Patent No.: US 12,550,587 B2
(45) Date of Patent: Feb. 10, 2026

(54) DISPLAY PANEL AND DISPLAY APPARATUS

(71) Applicant: SAMSUNG DISPLAY CO., LTD., Yongin-si (KR)

(72) Inventors: Hosik Shin, Yongin-si (KR); Gyehwan Lim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 364 days.

(21) Appl. No.: 18/226,381

(22) Filed: Jul. 26, 2023

(65) Prior Publication Data
US 2024/0040900 A1 Feb. 1, 2024

(30) Foreign Application Priority Data
Jul. 27, 2022 (KR) .................. 10-2022-0093465

(51) Int. Cl.
*H10K 59/80* (2023.01)
*H10K 59/121* (2023.01)
*H10K 102/00* (2023.01)

(52) U.S. Cl.
CPC ......... *H10K 59/87* (2023.02); *H10K 59/1213* (2023.02); *H10K 2102/351* (2023.02)

(58) Field of Classification Search
CPC .................................................. H10K 59/87
USPC ............................................... 313/498–512
See application file for complete search history.

(56) References Cited

U.S. PATENT DOCUMENTS

| 9,485,858 | B2 | 11/2016 | Namkung et al. |
| 11,360,517 | B2 | 6/2022 | Paek et al. |
| 2017/0271616 | A1 | 9/2017 | Choi et al. |
| 2018/0067522 | A1 | 3/2018 | Namkung et al. |
| 2021/0384465 | A1* | 12/2021 | Park .................. H10K 59/12 |
| 2022/0052141 | A1 | 2/2022 | Lee et al. |

FOREIGN PATENT DOCUMENTS

| CN | 107978626 A | * 5/2018 | ......... H10K 59/8793 |
| KR | 20170109724 | 10/2017 | |
| KR | 1020200002576 A | 1/2020 | |
| KR | 2151634 | 9/2020 | |
| KR | 20220022135 A | 2/2022 | |

* cited by examiner

*Primary Examiner* — Christopher M Raabe
(74) *Attorney, Agent, or Firm* — CANTOR COLBURN LLP

(57) ABSTRACT

The present disclosure relates to a display panel and a display apparatus. The display panel includes: a substrate including a main display area and a corner display area extending from a corner of the main display area; and a plurality of pixels arranged in the main display area and the corner display area. The substrate further includes: a first base layer; a first barrier layer arranged on the first base layer; and a second base layer arranged on the first barrier layer. A thickness of the substrate in the corner display area decreases away from the main display area.

20 Claims, 15 Drawing Sheets

DISPLAY PANEL AND DISPLAY APPARATUS

This application claims priority to Korean Patent Application No. 10-2022-0093465, filed on Jul. 27, 2022, and all the benefits accruing therefrom under 35 U.S.C. § 119, the content of which in its entirety is herein incorporated by reference.

BACKGROUND

1. Field

One or more embodiments relate to a display panel and a display apparatus including the same, and more particularly, to a display panel, in which a display area is increased in order to display an image on a side surface and in a corner area, and a display apparatus including the display panel.

2. Description of the Related Art

Designs of a display apparatus have diversified. For example, a curved-type display apparatus, a foldable display apparatus, and a rollable display apparatus have been developed. Also, a display area has been increased, and a non-display area has been decreased. Accordingly, various methods of designing a shape of a display apparatus have been derived.

SUMMARY

A display apparatus may include a display panel displaying an image. The display panel may include a corner area that is bent at a corner, and relatively great stress may occur in this corner area.

One or more embodiments include a display panel and a display apparatus, in which stress occurring in a corner area has decreased, and thus, reliability is increased.

Additional aspects will be set forth in part in the description which follows and, in part, will be apparent from the description, or may be learned by practice of the presented embodiments of the disclosure.

According to one or more embodiments, a display panel includes: a substrate including a main display area and a corner display area extending from a corner of the main display area, and a plurality of pixels arranged in the main display area and the corner display area of the substrate. The substrate further includes a first base layer, a first barrier layer arranged on the first base layer, and a second base layer arranged on the first barrier layer. A thickness of the substrate in the corner display area decreases away from the main display area.

A thickness of the first base layer in the corner display area may decrease away from the main display area.

The substrate may have a stair shape in the corner display area.

The corner display area may include a first corner display area adjacent to the main display area and a second corner display area extending from the first corner display area, wherein a driving circuit may be arranged in the first corner display area, and a plurality of extension areas may be arranged in the second corner display area.

The first base layer may include a first portion arranged in the main display area and a second portion arranged in the first corner display area, wherein a thickness of the second portion may decrease away from the main display area.

The second portion may have a stair shape.

The first base layer may further include a third portion arranged in the second corner display area.

A thickness of the third portion may be smaller than the thickness of the second portion.

The first base layer may have a stair shape in a portion of the first corner display area, and the portion may overlap a curved area of a cover window.

Some of a plurality of corner pixels arranged in the first corner display area of the plurality of pixels may at least partially overlap the driving circuit.

The display panel may further include a material layer arranged in the corner display area and arranged below the substrate.

The material layer may have a lower modulus than the first base layer.

According to one or more embodiments, a display panel includes: a substrate including a main display area and a corner display area extending from a corner of the main display area; a material layer arranged in the corner display area and arranged below the substrate; and a plurality of pixels arranged in the main display area and the corner display area. The substrate further includes: a first base layer arranged at least in the main display area and including a different material from the material layer; a first barrier layer arranged on the first base layer and the material layer; and a second base layer arranged on the first barrier layer. The material layer has a lower modulus than the first base layer.

At least a portion of the first base layer is arranged in the corner display area, and a thickness of the at least portion of the first base layer in the corner display area may decrease away from the main display area.

The first base layer may have a stair shape in the corner display area.

The corner display area may include a first corner display area adjacent to the main display area and a second corner display area extending from the first corner display area, wherein a driving circuit may be arranged in the first corner display area, a plurality of extension areas may be arranged in the second corner display area, and the material layer may overlap the first base layer in the first corner display area.

According to one or more embodiments, a display apparatus includes: a display panel; and a cover window arranged on the display panel. The display panel includes: a substrate including a main display area and a corner display area extending from a corner of the main display area; and a plurality of pixels arranged in the main display area and the corner display area. The substrate further includes: a first base layer; a first barrier layer arranged on the first base layer; and a second base layer arranged on the first barrier layer. A thickness of the substrate decreases away from the main display area.

The first base layer may include a first portion arranged in the main display area and a second portion arranged in the corner display area, and the second portion may have a stair shape.

The corner display area may include: a first corner display area adjacent to the main display area and a second corner display area extending from the first corner display area, where a driving circuit and the second portion of the first base layer may be arranged in the first corner display area, and a plurality of extension areas may be arranged in the second corner display area.

The cover window may include a central area and an edge area arranged outside the central area, the edge area may have a curved surface, the first corner display area may include a first partial area overlapping the edge area of the cover window and a second partial area overlapping the central area, and the second portion of the first base layer may be arranged to correspond to the first partial area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
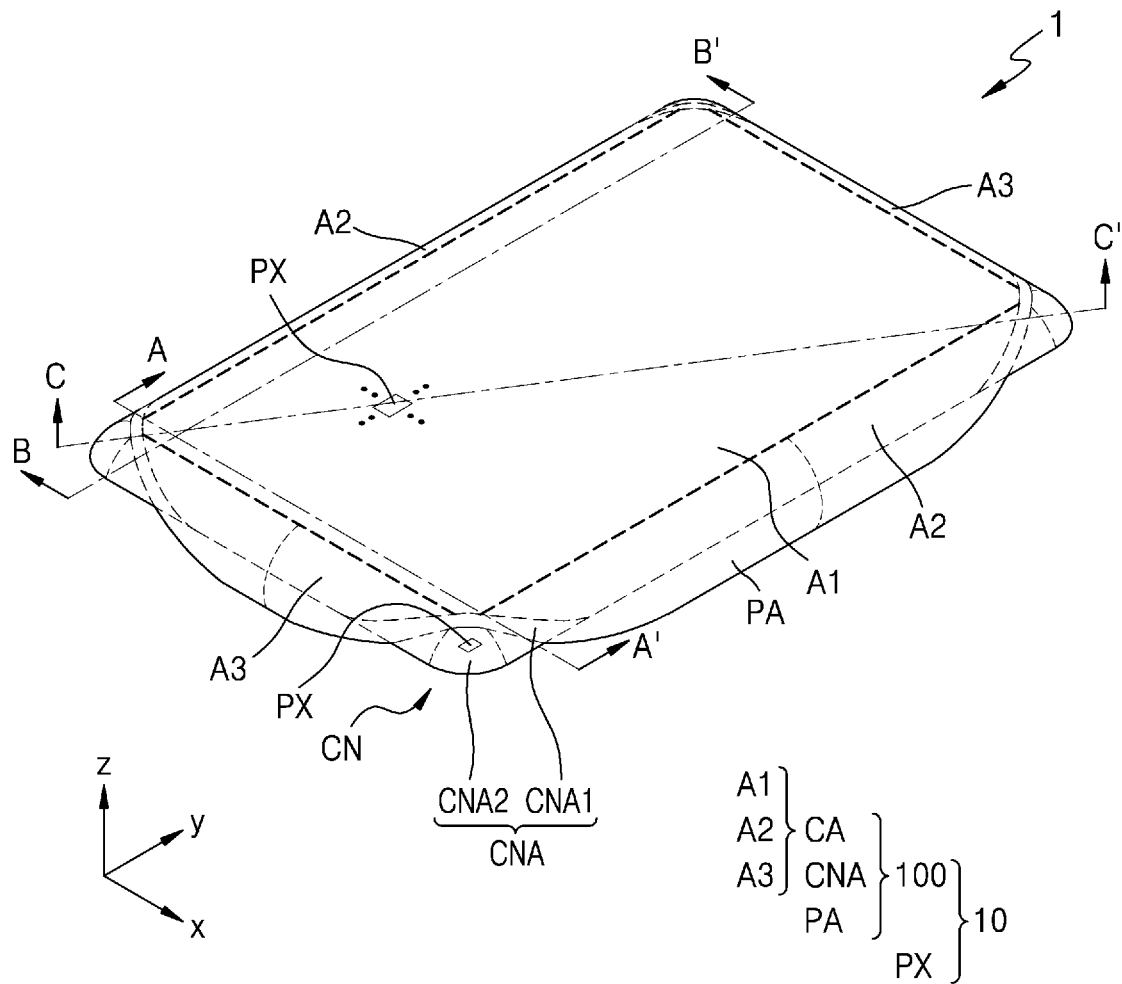
FIG. 1 is a schematic perspective view of a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, embodiments of the disclosure will be described in detail by referring to the accompanying drawings. In descriptions with reference to the drawings, the same reference numerals are given to components that are the same or substantially the same and descriptions will not be repeated.

In embodiments to be described hereinafter, when elements, such as a layer, a film, an area, a plate, etc. are referred to as being "on" another element, the reference may indicate not only a case where the element is "directly on" the other element, but also a case where yet another element is between the element and the other element. Also, for convenience of explanation, elements in the drawings may have exaggerated or reduced sizes. For example, sizes and thicknesses of the elements in the drawings are randomly indicated for convenience of explanation, and thus, the disclosure is not necessarily limited to the illustrations of the drawings.

It will be understood that the terms "first," "second," etc. may be used herein to describe various components, these components should not be limited by these terms. These terms are only used to distinguish one component from another.

As used herein, the singular expressions "a," "an," and "the" are intended to include the plural forms as well, unless the context clearly indicates otherwise.

In the following examples, the x-axis (or x direction), the y-axis (or y direction) and the z-axis (or z direction) are not limited to three axes (or three directions) of the rectangular coordinate system, and may be interpreted in a broader sense. For example, the x-axis (or x direction), the y-axis (or y direction), and the z-axis (or z direction) may be perpendicular to one another, or may represent different directions that are not perpendicular to one another.

Figure 2A:
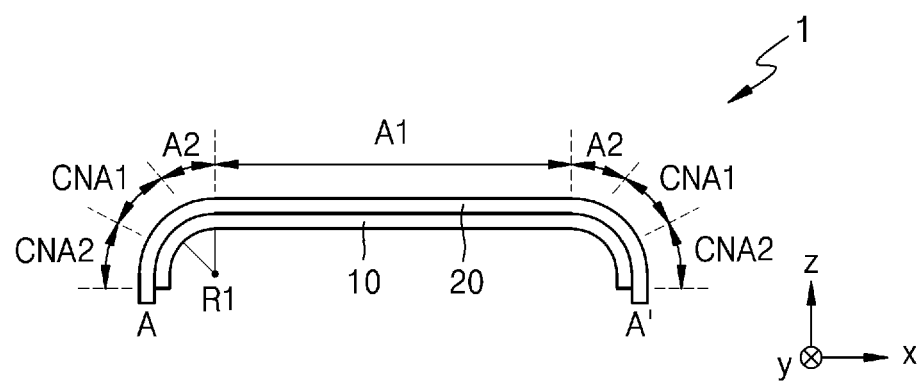
FIGS. 2A, 2B, and 2C are schematic cross-sectional views of a display apparatus according to an embodiment.
Figure 2B:
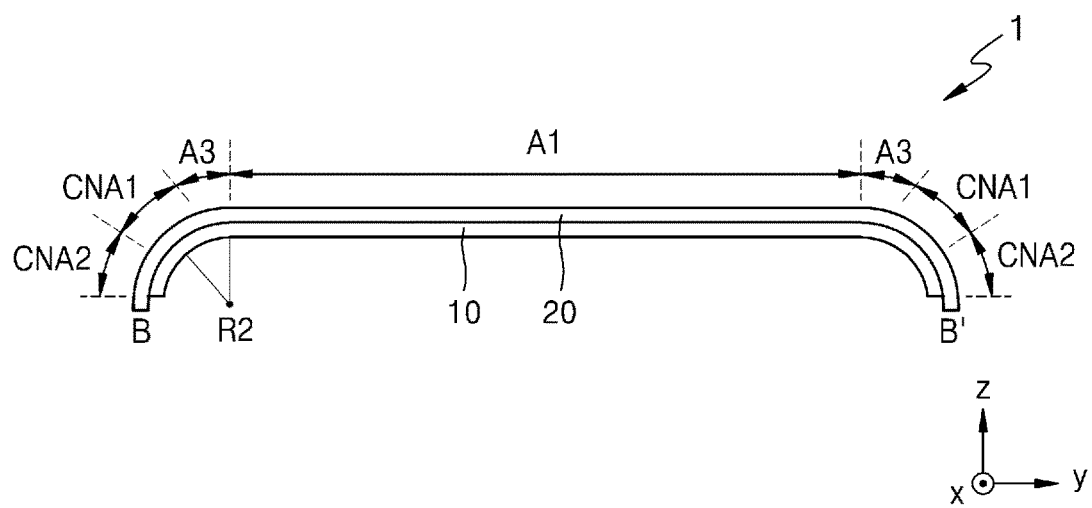
Figure 2C:
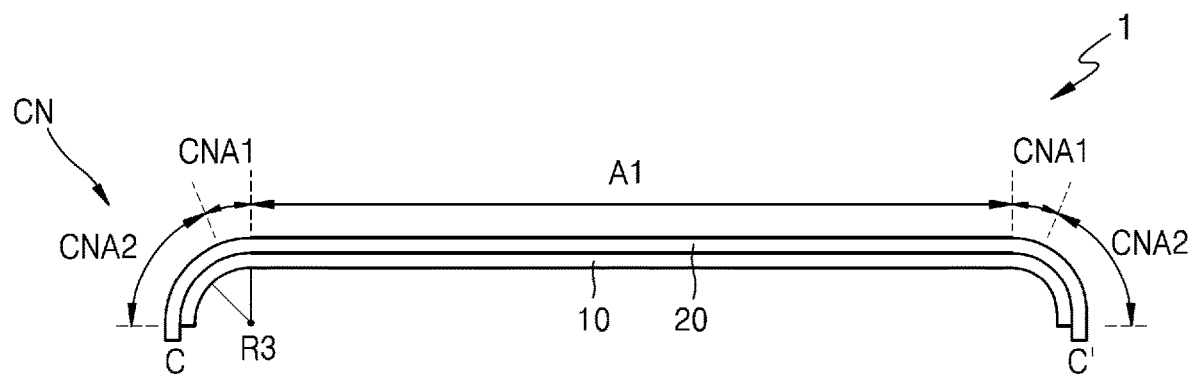

FIG. 1 is a schematic perspective view of a portion of a display apparatus 1 according to an embodiment. FIG. 2A is a schematic cross-sectional view of the display apparatus 1 taken along line A-A' of FIG. 1 according to an embodiment. FIG. 2B is a schematic cross-sectional view of the display apparatus 1 taken along line B-B' of FIG. 1 according to an embodiment. FIG. 2C is a schematic cross-sectional view of the display apparatus 1 taken along line C-C' of FIG. 1 according to an embodiment.

The display apparatus 1 may be an apparatus displaying a video image or a still image and may include a portable electronic device, such as a mobile phone, a smartphone, a tablet personal computer ("PC"), a mobile communication terminal, an electronic notebook, an electronic book, a portable multimedia player ("PMP"), a navigation device, or an ultra mobile PC ("UMPC"). However, the display apparatus 1 may also include an electronic device, such as a television, a notebook computer, a monitor, an advertising board, or an Internet of things ("IoT") device. Alternatively, the display apparatus 1 may include a wearable device, such as a smartwatch, a watch phone, a glasses-type display, or a head-mounted display ("HMD"). Alternatively, the display apparatus 1 may be a portion of another device. For example, the display apparatus 1 may be a display of an arbitrary electronic device. Alternatively, the display apparatus 1 may be used as: a gauge of a vehicle, a center fascia of a vehicle, or a center information display on a dashboard; a room mirror display substituting a side-view mirror of a vehicle; or a display disposed on a rear surface of a front seat, as an entertainment device for a backseat of a vehicle.

Referring to FIGS. 1 and 2A to 2C, the display apparatus 1 which may display an image may have an edge extending in a first direction and an edge extending in a second direction. Here, the first direction and the second direction may cross each other. For example, an angle formed by the first direction and the second direction may be an acute angle. Alternatively, the angle formed by the first direction and the second direction may be an obtuse angle or a right angle. Hereinafter, a case in which the first direction and the second direction are perpendicular to each other is mainly described, for convenience. For example, the first direction may be an x direction or a −x direction, and the second direction may be a y direction or a −y direction.

A corner CN, at which the edge extending in the first direction (the x direction or the −x direction) and the edge extending in the second direction (the y direction or the −y direction) meet each other, may have a predetermined curvature.

The display apparatus 1 may include a cover window 20 and a display panel 10. The cover window 20 may protect the display panel 10. According to an embodiment, the cover window 20 may be arranged on the display panel 10. According to an embodiment, the cover window 20 may include a flexible window. The cover window 20 may become easily bent by an external force and may protect the display panel 10. The cover window 20 may include glass, sapphire, or plastic. The cover window 20 may include ultra-thin glass. Alternatively, the cover window 20 may include colorless polyimide.

The display panel 10 may be arranged below the cover window 20. The display panel 10 may be bonded to the cover window 20, for example, by an optically clear adhesive ("OCA") not shown.

The display panel 10 may display an image. The display panel 10 may include a substrate 100 and a pixel PX. According to an embodiment, the display panel 10 may further include a material layer ML (see FIG. 7). The display panel 10 may include a main display area CA, a corner display area CNA, and a peripheral area PA. For example, the substrate 100 included in the display panel 10 may include the main display area CA, the corner display area CNA, and the peripheral area PA. That is, the main display area CA, the corner display area CNA, and the peripheral area PA may be defined on the substrate 100.

The main display area CA may include a first area A1, a second area A2, and a third area A3. The first area A1 may be arranged at a center of the display apparatus 1. The first area A1 may be referred to as a central display area. The first area A1 may be a flat area. The display apparatus 1 may provide most of the image in the first area A1.

The second area A2 and the third area A3 may be arranged on side surfaces of the display panel 10. The second area A2 and the third area A3 may be referred to as side display areas. Each of the second and third areas A2 and A3 may extend from a side of the first area A1.

The second area A2 may be adjacent to the first area A1 in the first direction (e.g., the x direction or the −x direction). The second area A2 may extend in the second direction (e.g., the y direction or the −y direction). The display panel 10 may bend in the second area A2. That is, the second area A2 may be defined as an area bending on a cross-section (e.g., a z-x cross-section) parallel with the first direction, unlike the first area A1. However, the second area A2 may not bend on a cross-section (e.g., a y-z cross-section) parallel with the second direction. That is, the second area A2 may bend based on an axis extending in the second direction.

FIG. 2A illustrates that the second area A2 arranged in the x direction from the first area A1 and the second area A2 arranged in the −x direction from the first area A1 may have the same curvature as each other. However, the disclosure is not limited thereto. For example, the second area A2 arranged in the x direction from the first area A1 and the second area A2 arranged in the −x direction from the first area A1 may have different curvatures from each other in another embodiment.

The third area A3 may be adjacent to the first area A1 in the second direction. The third area A3 may extend in the first direction. The display panel 10 may bend in the third area A3. That is, the third area A3 may be defined as an area bending on the cross-section (e.g., the y-z cross-section) parallel with the second direction, unlike the first area A1. However, the third area A3 may not bend on the cross-section (e.g., the z-x cross-section) parallel with the first direction. That is, the third area A3 may bend based on an axis extending in the first direction.

FIG. 2B illustrates that the third area A3 arranged in the y direction from the first area A1 and the third area A3 arranged in the −y direction from the first area A1 may have the same curvature as each other. However, the disclosure is not limited thereto. For another example, the third area A3 arranged in the y direction from the first area A1 and the third area A3 arranged in the −y direction from the first area A1 may have different curvatures from each other.

The display panel 10 may bend in the corner display area CNA. The corner display area CNA may be arranged at the corner CN. That is, the corner display area CNA may be where the edge of the display apparatus 1 in the first direction and the edge of the display apparatus 1 in the second direction meet each other. The corner display area CNA may extend at a corner of the main display area CA. The corner display area CNA may extend at a corner of the first area A1. The corner display area CNA may be arranged between the second area A2 and the third area A3 adjacent to each other. The corner display area CNA may at least partially surround the first area A1, the second area A2, and the third area A3. The display apparatus 1 may have a plurality of corner display areas CNA.

The corner display area CNA may include a first corner display area CNA1 and a second corner display area CNA2. The first corner display area CNA1 may be adjacent to the main display area CA. The second corner display area CNA2 may extend from the first corner display area CNA1.

The first corner display area CNA1 may be arranged between the main display area CA and the second corner display area CNA2. The first corner display area CNA1 may extend in the direction in which the second area A2 extends, between the first area A1 and the second corner display area CNA2. The first corner display area CNA1 may extend in the direction in which the third area A3 extends, between the third area A3 and the second corner display area CNA2. The first corner display area CNA1 may bend. A driving circuit configured to provide an electrical signal to the pixel PX and a power line configured to provide power to the pixel PX may be arranged in the first corner display area CNA1. In an embodiment, the pixel PX arranged in the first corner display area CNA1 may overlap the driving circuit and/or the power line in a plan view. As used herein, the "plan view" is a view viewed from z direction.

The second corner display area CNA2 may be arranged more adjacent to an edge of the substrate 100 than the first corner display area CNA1. The second corner display area CNA2 may bend. When the second area A2 extends in the second direction and bends on the cross-section (e.g., the z-x cross-section) parallel with the first direction, and the third area A3 extends in the first direction and bends on the cross-section (e.g., the y-z cross-section) parallel with the second direction, at least a portion of the second corner display area CNA2 may bend on both the cross-section (e.g., the z-x cross-section) parallel with the first direction and the cross-section (e.g., the y-z cross-section) parallel with the second direction. That is, at least a portion of the second corner display area CNA2 may be a multi-curved area in which a plurality of curvatures in a plurality of directions overlap one another.

The peripheral area PA may be arranged outside the main display area CA. In detail, the peripheral area PA may be arranged outside the second area A2 and the third area A3. The pixel PX may not be arranged in the peripheral area PA. That is, the peripheral area PA may be a non-display area, in which an image is not displayed. A driving circuit configured to provide an electrical signal to the pixel PX or a power line configured to provide power to the pixel PX may be arranged in the peripheral area PA.

As illustrated in FIG. 2A, a portion of the second corner display area CNA2, the first corner display area CNA1, and the second area A2 may bend by a first radius of curvature R1. As illustrated in FIG. 2B, another portion of the second corner display area CNA2, the first corner display area CNA1, and the third area A3 may bend by a second radius of curvature R2. However, as illustrated in FIG. 2C, another portion of the second corner display area CNA2 and the first corner display area CNA1 may bend by a third radius of curvature R3.

The pixel PX may be arranged on the substrate 100. According to an embodiment, the pixel PX may be implemented by a display element DPE (see FIGS. 5B and 6). Each pixel PX may include a red sub-pixel, a green sub-pixel, and a blue sub-pixel. Alternatively, each pixel PX may include a red sub-pixel, a green sub-pixel, a blue sub-pixel, and a white sub-pixel.

The pixel PX may be arranged in at least one of the main display area CA and the corner display area CNA. That is, the pixel PX may be arranged in at least one of the first area A1, the second area A2, the third area A3, the first corner display area CNA1, and the second corner display area CNA2. For example, the plurality of pixels PX may be arranged in the first area A1, the second area A2, the third area A3, the first corner display area CNA1, and the second corner display area CNA2. Accordingly, the display apparatus 1 may display an image in the first area A1, the second area A2, the third area A3, the first corner display area CNA1, and the second corner display area CNA2. In another embodiment, the display apparatus 1 may provide a separate image in each of the first area A1, the second area A2, the third area A3, the first corner display area CNA1, and the second corner display area CNA2. Alternatively, the display apparatus 1 may provide a portion of an image in each of the first area A1, the second area A2, the third area A3, the first corner display area CNA1, and the second corner display area CNA2.

As described above, the display apparatus 1 may display an image not only in the first area A1, but also in the second area A2, the third area A3, the first corner display area CNA1, and the second corner display area CNA2. Thus, in the display apparatus 1, a display area, in which an image is displayed, may be significantly increased. Also, the display apparatus 1 may display an image at the corner CN that is bent, and thus, an aesthetic sense may be improved.

Figure 3A:
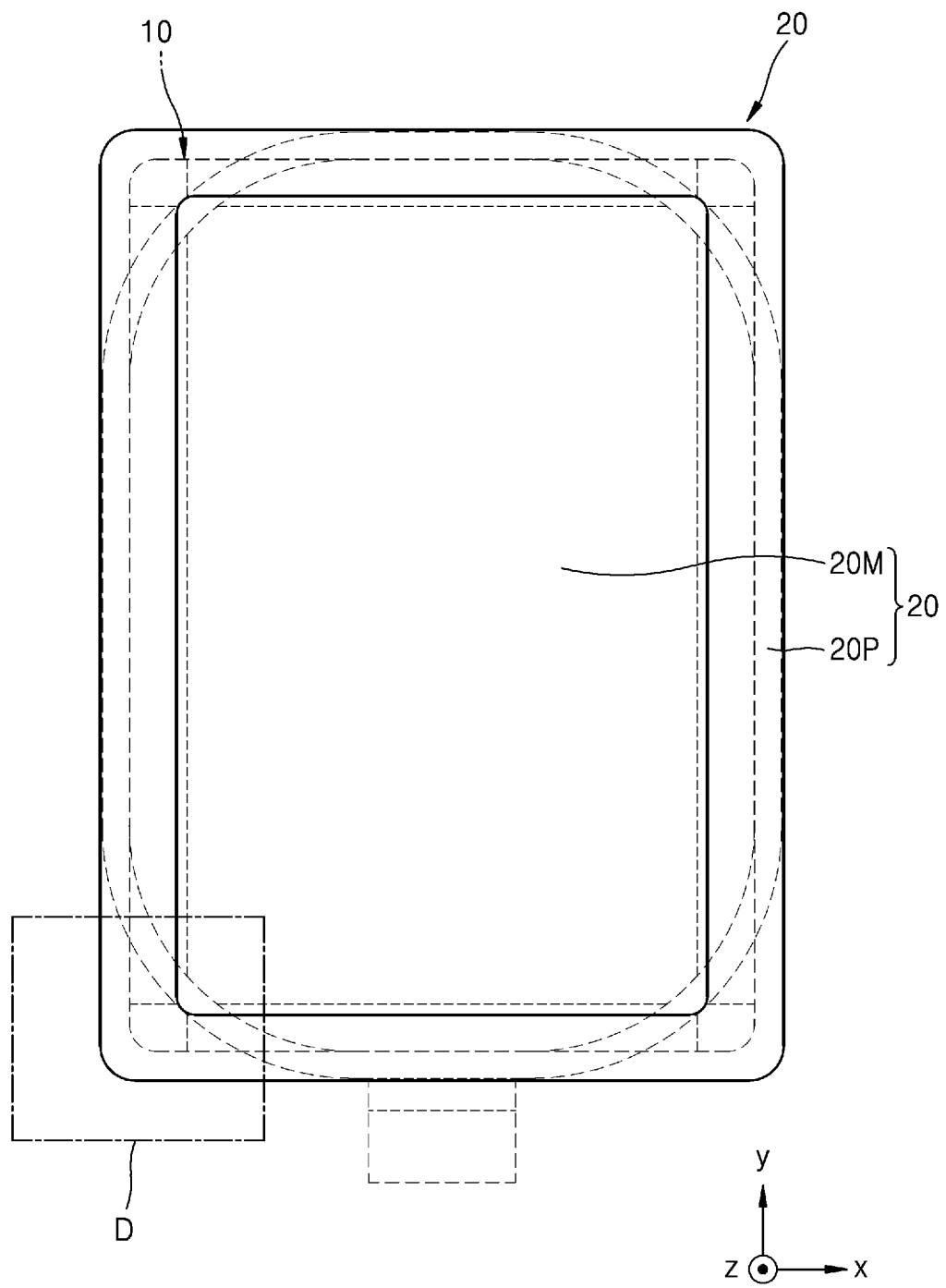
FIG. 3A is a schematic plan view of a portion of a display apparatus according to an embodiment.
Figure 3B:
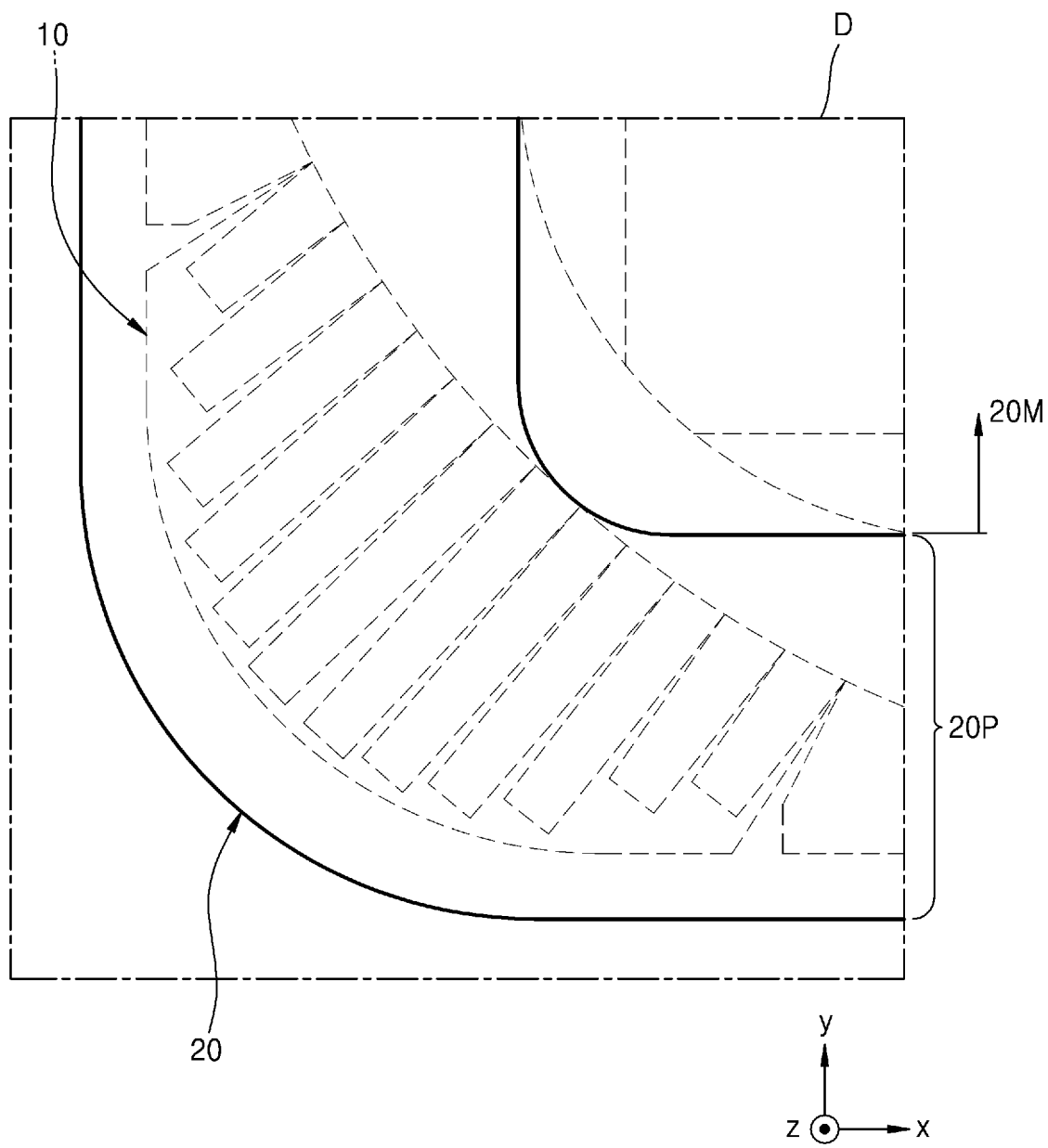
FIG. 3B is an enlarged view of a portion of a display apparatus according to an embodiment.

FIG. 3A is a schematic plan view of the cover window 20 included in the display apparatus 1 of FIG. 1 according to an embodiment. FIG. 3A schematically illustrates a state of the cover window 20, in which the cover window 20 is not bent and is flat. FIG. 3B is an enlarged view of region D of FIG. 3A according to an embodiment.

Referring to FIGS. 3A and 3B, also referring to FIG. 1, the cover window 20 may include a central area 20M and an edge area 20P. A shape of the cover window 20 may match (correspond to) a shape of the display panel 10, to which the cover window 20 is applied. For example, the cover window 20 may include a flat area and a curved area that is bent.

The central area 20M of the cover window 20 may correspond to a shape of the first area A1 of the display panel 10. The central area 20M may be a flat area. The central area 20M may be arranged at a center of the cover window 20. A corner of the central area 20M may correspond to a portion of the corner display area CNA of the display panel 10. For example, the corner of the central area 20M may correspond to a central portion of the first corner display area CNA1 of the display panel 10.

The edge area 20P may correspond to an area defined by borders of the second area A2, the third area A3, and the corner display area CNA of the display panel 10. The edge area 20P may be arranged outside the central area 20M. The edge area 20P of the cover window 20 may include a side surface portion and a corner portion of the cover window 20. The edge area 20P may bend by a predetermined curvature. That is, the edge area 20P may include a curved surface. Also, the edge area 20P may have a constant curvature or a varying curvature.

Figure 4A:
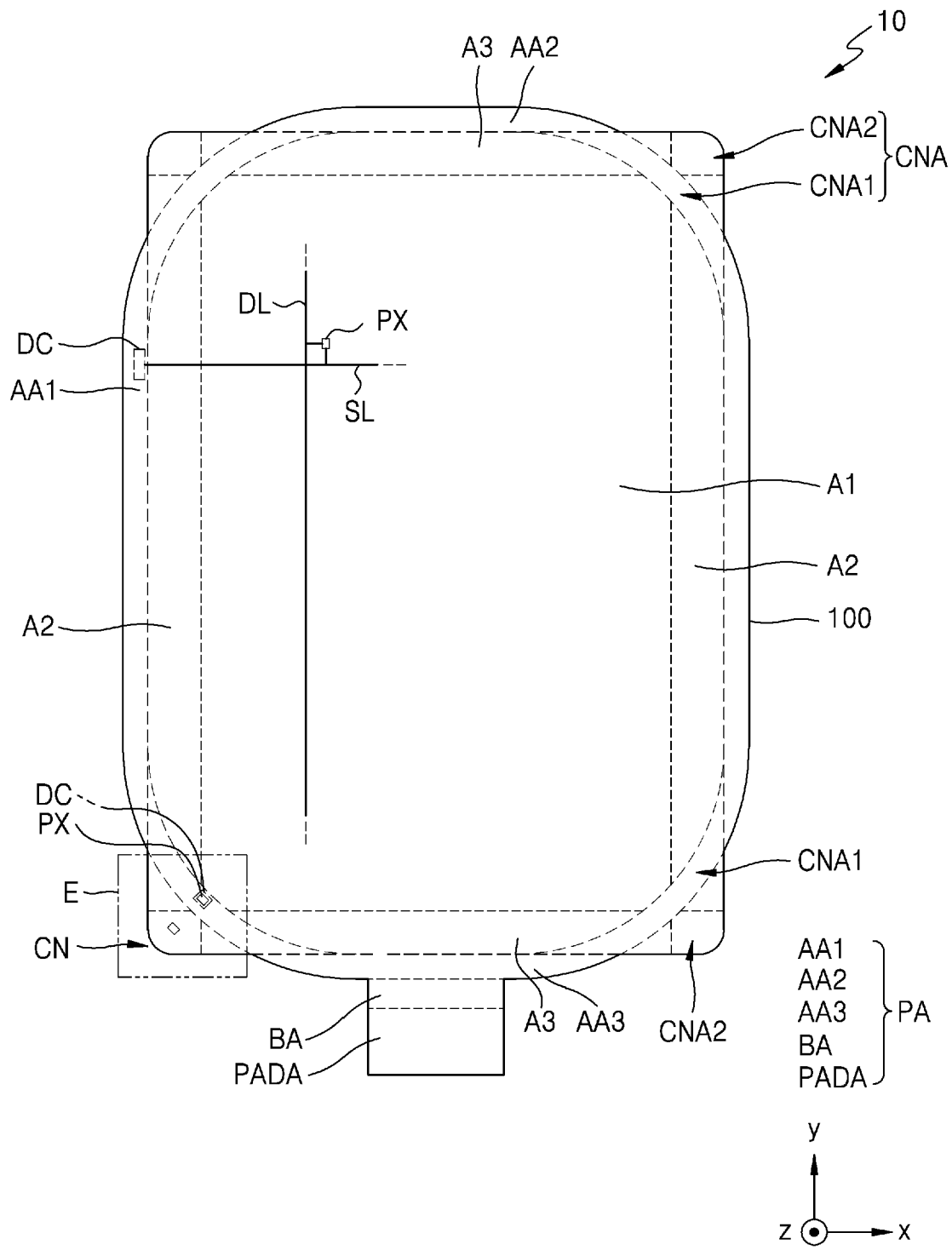
FIG. 4A is a schematic plan view of a portion of a display apparatus according to an embodiment.
Figure 4B:
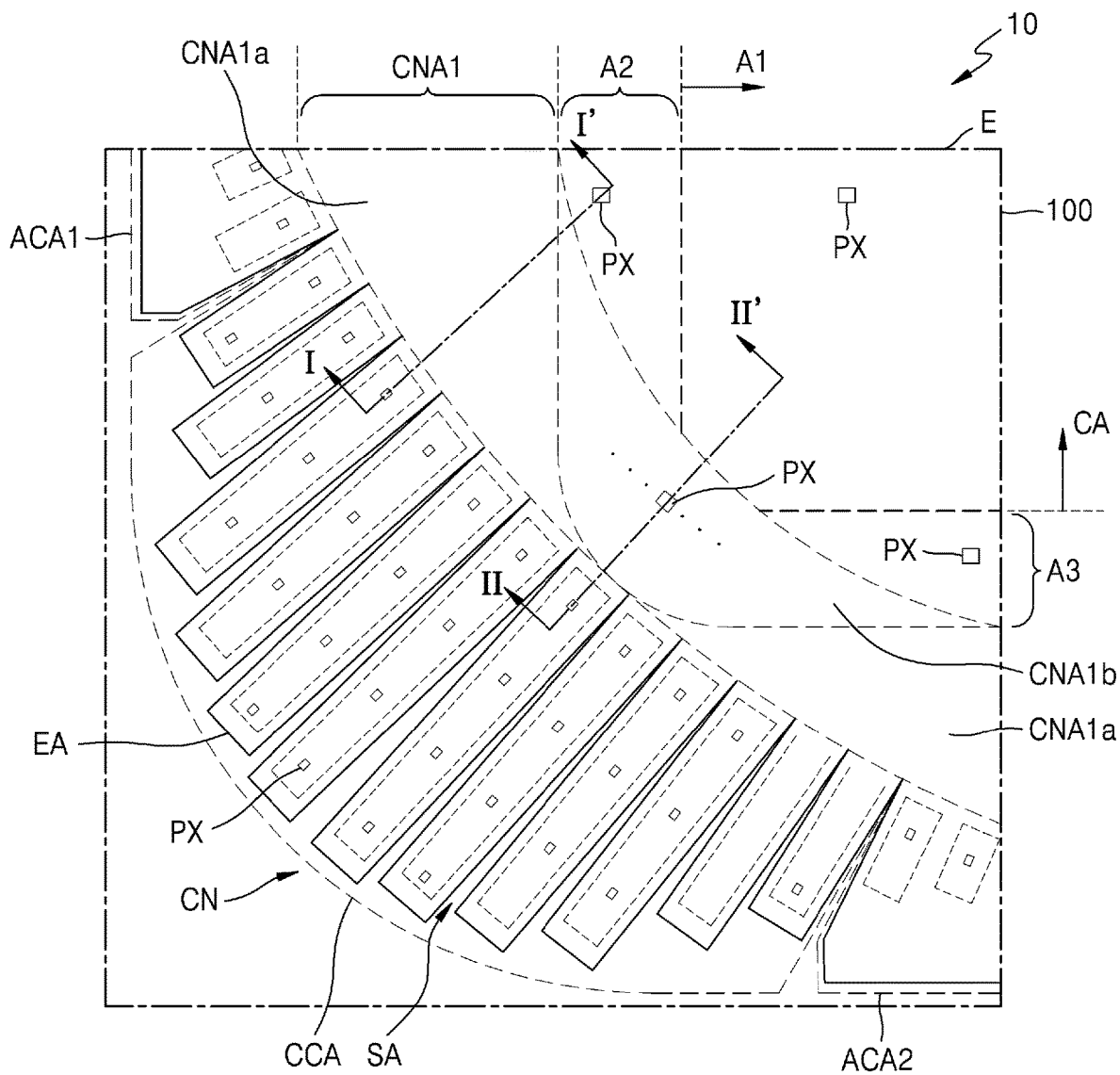
FIG. 4B is an enlarged view of a portion of a display apparatus according to an embodiment.

FIG. 4A is a schematic plan view of the display panel 10 included in the display apparatus 1 of FIG. 1 according to an embodiment. FIG. 4A schematically illustrates a state of the display panel 10, in which the display panel 10 is not bent and is flat. FIG. 4B is an enlarged view of region E of FIG. 4A according to an embodiment.

Referring to FIG. 4A, also referring to FIG. 1, the peripheral area PA may be arranged outside the main display area CA, as described above. The peripheral area PA may include a first adjacent area AA1, a second adjacent area AA2, a third adjacent area AA3, a bending area BA, and a pad area PADA.

The first adjacent area AA1 may be arranged outside the second area A2. That is, the second area A2 may be arranged between the first adjacent area AA1 and the first area A1. Accordingly, the first adjacent area AA1 may be arranged in the first direction from the second area A2 and may extend in the second direction, like the second area A2. A driving circuit DC and/or a power line may be arranged in the first adjacent area AA1.

The second adjacent area AA2 and the third adjacent area AA3 may be arranged outside the third area A3. That is, the third areas A3 may be arranged between the second adjacent area AA2 and the first area A1 and between the third adjacent area AA3 and the first area A1. The second adjacent area AA2 and the third adjacent area AA3 may extend in the first direction, like the third area A3. The third areas A3 and the first area A1 may be arranged between the second adjacent area AA2 and the third adjacent area AA3.

The bending area BA may be arranged outside the third adjacent area AA3. That is, the third adjacent area AA3 may be arranged between the bending area BA and the third area A3. Also, the pad area PADA may be arranged outside the bending area BA. That is, the bending area BA may be arranged between the third adjacent area AA3 and the pad area PADA. The display panel 10 may bend in the bending area BA. In this case, the pad area PADA may be arranged to overlap another portion of the display panel 10. Accordingly, an area of the peripheral area PA that is seen by a user may be minimized. A pad (not shown) may be arranged in the pad area PADA. The display panel 10 may receive an electrical signal and/or a power voltage through the pad.

FIG. 4A illustrates the state of the display panel 10, in which the display panel 10 is not bent and is flat. However, as described above, a portion of the display panel 10 may be bent. That is, at least one of the second area A2, the third area A3, the first corner display area CNA1, and the second corner display area CNA2 may be bent.

In detail, the second area A2 may bend based on the axis extending in the second direction. Accordingly, the second area A2 may bend on the cross-section (e.g., the z-x cross-section) parallel with the first direction and may not bend on the cross-section (e.g., the y-z cross-section) parallel with the second direction. The third area A3 may bend based on the axis extending in the first direction. Accordingly, the third area A3 may bend on the cross-section (e.g., the y-z cross-section) parallel with the second direction and may not bend on the cross-section (e.g., the z-x cross-section) parallel with the first direction. At least a portion of the second corner display area CNA2 may bend on both the cross-section (e.g., the z-x cross-section) parallel with the first direction and the cross-section (e.g., the y-z cross-section) parallel with the second direction. Accordingly, the at least the portion of the second corner display area CNA2 may be a multi-curved area in which a plurality of curvatures in a plurality of directions overlap one another.

When the corner display area CNA bends as described above, a compressive strain which may occur in the corner display area CNA may be greater than a tensile strain which may occur in the corner display area CNA. Thus, it may be desirable to apply a lower structure (the substrate 100 and the material layer ML) having a relatively low modulus to at least a portion of the corner display area CNA. Thus, a structure of the display panel 10 in the corner display area CNA may be different from a structure of the display panel 10 in the main display area CA. In this specification, a modulus may be the Young's modulus or a modulus of elasticity defining a relationship between the stress and the strain.

As described above, the pixel PX, which may be arranged in at least one of the first area A1, the second area A2, the third area A3, the first corner display area CNA1, and the second corner display area CNA2, may include a display element. The display element may include an organic light-emitting diode including an organic emission layer. Alternatively, the display element may include a light-emitting diode including an inorganic emission layer. A size of the light-emitting diode may be micro-scale or nano-scale. For example, the light-emitting diode may include a micro-light-emitting diode. Alternatively, the light-emitting diode may include a nanorod-light-emitting diode. The nanorod-light-emitting diode may include gallium nitride (GaN). In another embodiment, a color conversion layer may be arranged on the display element. In this case, the color conversion layer may include quantum dots. Alternatively, the display element may include a quantum dot light-emitting diode including a quantum dot emission layer. Hereinafter, a case in which the display element includes an organic light-emitting diode is described, for convenience.

The pixel PX may include a plurality of sub-pixels, and each of the plurality of sub-pixels may emit a predetermined color of light by using the display element. The sub-pixel denotes a smallest unit for realizing an image and corresponds to an emission area. When the organic light-emitting diode is implemented as the display element, the emission area may be defined by an opening of a pixel-defining layer. This aspect will be described below.

The driving circuit DC may be configured to provide a signal to the pixels PX. For example, the driving circuit DC may include a scan driving circuit configured to provide, through a scan line SL, a scan signal to pixel circuits electrically connected to the sub-pixels included in the pixel PX. Alternatively, the driving circuit DC may include an emission control driving circuit configured to provide, through an emission control line (not shown), an emission control signal to the pixel circuits electrically connected to the sub-pixels. Alternatively, the driving circuit DC may include a data driving circuit configured to provide, through a data line DL, a data signal to the pixel circuits electrically connected to the sub-pixels. Although not shown, the data driving circuit may be arranged in the third adjacent area AA3 or the pad area PADA. Alternatively, the data driving circuit may be arranged on a display circuit board connected to the display panel 10 through a pad.

Referring to FIG. 4B, the display panel 10 may include the substrate 100 including the first area A1, the second area A2, the third area A3, the first corner display area CNA1, and the second corner display area CNA2.

The second area A2 may be adjacent to the first area A1 in the first direction (the x direction or the −x direction). The second area A2 may extend in the second direction (the y direction or the −y direction). The third area A3 may be adjacent to the first area A1 in the second direction. The third area A3 may extend in the first direction.

The first corner display area CNA1 may be arranged between the first area A1 and the second corner display area CNA2. The first corner display area CNA1 may extend between the first area A1 and a first adjacent corner area ACA1. The first corner display area CNA1 may extend between the first area A1 and a second adjacent corner area ACA2. The first corner display area CNA1 may at least partially surround the first area A1, the second area A2, and the third area A3.

The first corner display area CNA1 may include a first partial area CNA1a and a second partial area CNA1b. The first partial area CNA1a of the first corner display area CNA1 may overlap a curved area of the cover window 20 (see FIGS. 1 and 3B) in a plan view. The first partial area CNA1a of the first corner display area CNA1 may overlap the edge area 20P (see FIG. 3B) of the cover window 20 (see FIG. 3B). The second partial area CNA1b of the first corner display area CNA1 may overlap a flat area of the cover window 20 (see FIGS. 1 and 3B). The second partial area CNA1b of the first corner display area CNA1 may overlap the central area 20M (see FIG. 3B) of the cover window (see FIG. 3B) in a plan view. The first partial area CNA1a may be arranged closer to the first adjacent corner area ACA1 or the second adjacent corner area ACA2, to be described below, than the second partial area CNA1b.

The second corner display area CNA2 may include a central corner area CCA, the first adjacent corner area ACA1, and the second adjacent corner area ACA2.

The central corner area CCA may include an extension area EA. The extension area EA may extend in a direction away from the first area A1. The display panel 10 may include a plurality of extension areas EA. Each of the plurality of extension areas EA may extend in the direction away from the first area A1. For example, the plurality of extension areas EA may extend in a direction crossing the first direction (the x direction or the −x direction) and the second direction (the y direction or the −y direction).

A spaced area SA may be defined between an adjacent pair of the plurality of extension areas EA. The spaced area SA may be an area, in which components of the display panel 10 are not arranged. When the central corner area CCA bends at the corner CN, a compressive strain occurring in the central corner area CCA may be greater than a tensile strain occurring in the central corner area CCA. However, in the case of the display apparatus 1 according to the present embodiment, the spaced area SA may be defined between the adjacent extension areas EA, and thus, the display panel 10 may bend without being damaged in the central corner area CCA.

The first adjacent corner area ACA1 may be adjacent to the central corner area CCA. At least a portion of the second area A2 and the first adjacent corner area ACA1 may be arranged in the first direction (the x direction or the −x direction). An end of the first adjacent corner area ACA1 in a direction of the central corner area CCA may be apart from an end of the central corner area CCA in a direction of the first adjacent corner area ACA1. The first adjacent corner area ACA1 may bend on the cross-section (the z-x cross-section) parallel with the first direction and may not bend on the cross-section (the y-z cross-section) parallel with the second direction. The spaced area SA may not be defined in the first adjacent corner area ACA1 described above.

The second adjacent corner area ACA2 may also be adjacent to the central corner area CCA. At least a portion of the third area A3 and the second adjacent corner area ACA2 may be arranged in the second direction (the y direction or the −y direction). An end of the second adjacent corner area ACA2 in a direction of the central corner area CCA may be apart from an end of the central corner area CCA in a direction of the second adjacent corner area ACA2. The second adjacent corner area ACA2 may bend on the cross-section (the z-x cross-section) parallel with the first direction and may not bend on the cross-section (the y-z cross-section) parallel with the second direction. The spaced area SA may not be defined in the second adjacent corner area ACA2 described above.

As illustrated in FIG. 4B, the plurality of pixels PX may be arranged in the first area A1, the second area A2, the third area A3, the first corner display area CNA1, and the second corner display area CNA2. Accordingly, the display panel 10 may display an image in the first area A1, the second area A2, the third area A3, the first corner display area CNA1, and the second corner display area CNA2. The pixel PX may include a display element DPE (see FIG. 5B).

Figure 5A:
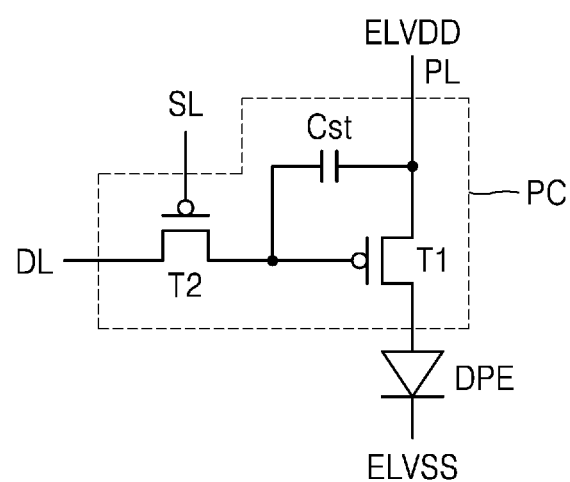
FIGS. 5A and 5B are schematic equivalent circuit diagrams of a pixel circuit which may be applied to a display panel.
Figure 5B:
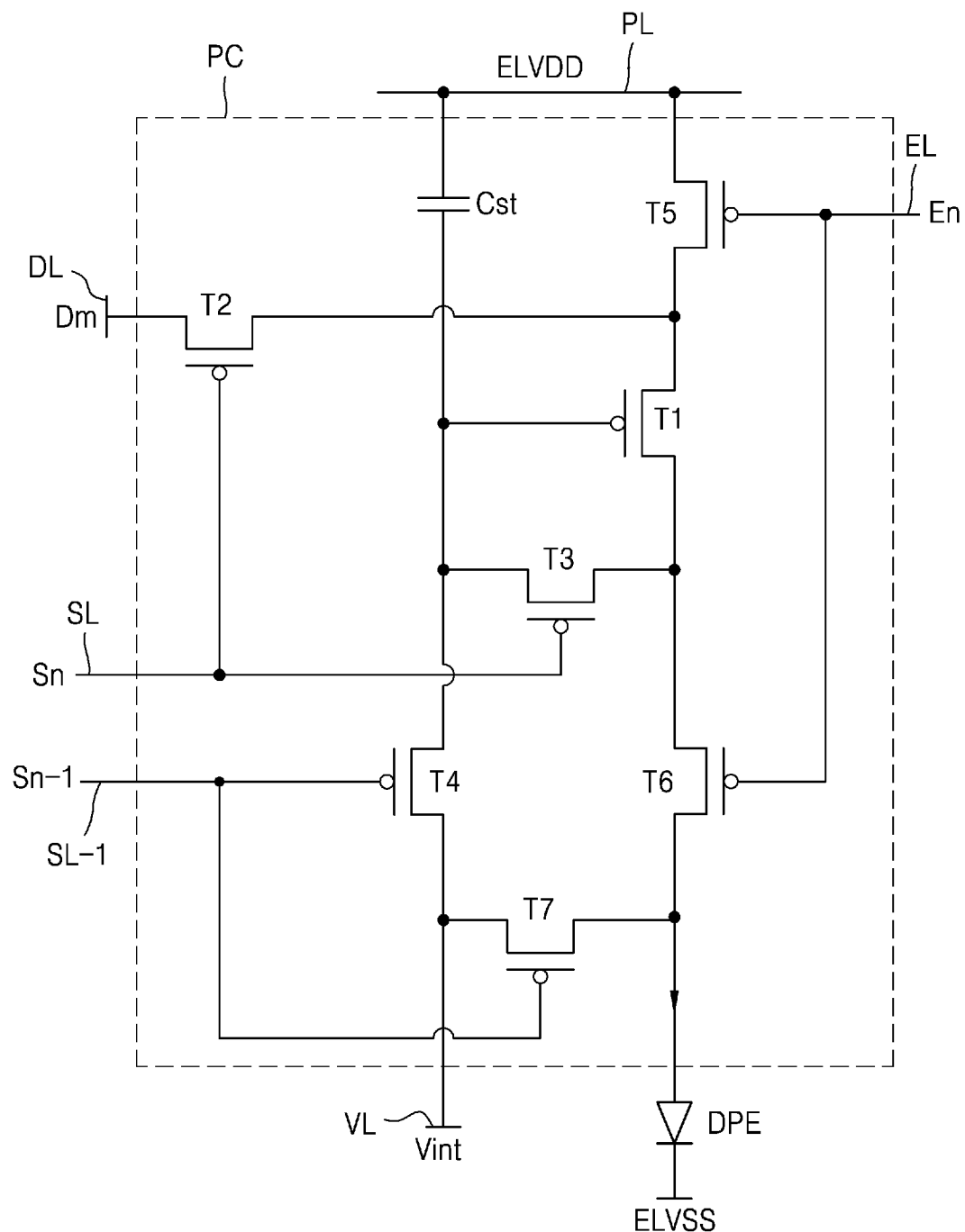

FIGS. 5A and 5B are equivalent circuit diagrams of examples of a pixel circuit PC included in the display apparatus 1 of FIG. 1. That is, FIGS. 5A and 5B are the equivalent circuit diagrams of the pixel circuit PC electrically connected to an organic light-emitting diode, which is the display element DPE included in one or more pixels included in the display apparatus 1 of FIG. 1.

Referring to FIG. 5A, the pixel circuit PC may be electrically connected to the display element DPE. The pixel circuit PC may include a driving thin-film transistor T1, a switching thin-film transistor T2, and a storage capacitor Cst. According to an embodiment, the display element DPE may emit red, green, or blue light, or may emit red, green, blue, or white light.

The switching thin-film transistor T2 may be connected to a scan line SL and a data line DL and may be configured to transmit a data signal provided through the data line DL, to the driving thin-film transistor T1, in response to a scan signal provided through the scan line SL.

The storage capacitor Cst may be connected to the switching thin-film transistor T2 and a driving voltage line PL and may be configured to store a voltage corresponding to a difference between a voltage received from the switching thin-film transistor T2 and a first power voltage ELVDD supplied to the driving voltage line PL.

The driving thin film transistor T1 may be connected to the driving voltage line PL and the storage capacitor Cst and may be configured to control a driving current flowing from the driving voltage line PL through the display element DPE, in correspondence with a value of the voltage stored in the storage capacitor Cst. The display element DPE may emit light having a predetermined brightness according to the driving current. An opposite electrode of the display element DPE may receive a second power voltage ELVSS.

FIG. 5A illustrates that the pixel circuit PC includes two thin-film transistors and one storage capacitor. However, the pixel circuit PC may include more thin-film transistors than the thin-film transistors illustrated in FIG. 5A.

Referring to FIG. 5B, the pixel circuit PC may include the driving thin-film transistor T1 and a plurality of switching thin-film transistors. The switching thin-film transistors may include a data write thin-film transistor T2, a compensation thin-film transistor T3, a first initialization thin-film transistor T4, an operation control thin-film transistor T5, an emission control thin-film transistor T6, and a second initialization thin-film transistor T7.

FIG. 5B illustrates that each pixel circuit PC includes a scan line SL, a previous scan line SL−1, an emission control line EL, a data line DL, an initialization voltage line VL, and a driving voltage line PL. However, according to another embodiment, at least one of the scan line SL, the previous scan line SL−1, the emission control line EL, the data line DL, the driving voltage line PL and/or the initialization voltage line VL may be shared by adjacent pixel circuits.

A drain electrode of the driving thin-film transistor T1 may be electrically connected to the display element DPE through the emission control thin-film transistor T6. The driving thin-film transistor T1 may be configured to receive a data signal Dm according to a switching operation of the data write thin-film transistor T2 and supply a driving current to the display element DPE.

A gate electrode of the data write thin-film transistor T2 may be connected to the scan line SL, and a source electrode of the data write thin-film transistor T2 may be connected to the data line DL. A drain electrode of the data write thin-film transistor T2 may be connected to a source electrode of the driving thin-film transistor T1 and may be connected to the driving voltage line PL through the operation control thin-film transistor T5.

The data write thin-film transistor T2 may be turned on in response to a scan signal Sn transmitted through the scan line SL and may be configured to perform a switching operation of transmitting a data signal Dm transmitted through the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1 and may be connected to a pixel electrode of the display element DPE through the emission control thin-film transistor T6. A drain electrode of the compensation thin-film transistor T3 may be connected to one electrode of the storage capacitor Cst, a source electrode of the first initialization thin-film transistor T4, and a gate electrode of the driving thin-film transistor T1. The compensation thin-film transistor T3 may be turned on in response to a scan signal Sn transmitted through the scan line SL and may be configured to connect the gate electrode of the driving thin-film transistor T1 to the drain electrode of the driving thin-film transistor T1 to diode-connect the driving thin-film transistor T1.

A gate electrode of the first initialization thin-film transistor T4 may be connected to the previous scan line SL−1. A drain electrode of the first initialization thin-film transistor T4 may be connected to the initialization voltage line VL. The source electrode of the first initialization thin-film transistor T4 may be connected to one electrode of the storage capacitor Cst, the drain electrode of the compensation thin-film transistor T3, and the gate electrode of the driving thin-film transistor T1. The first initialization thin-film transistor T4 may be turned on in response to a previous scan signal Sn−1 received through the previous scan line SL−1 and may be configured to perform an initialization operation of initializing a voltage of the gate electrode of the driving thin-film transistor T1 by transmitting an initialization voltage Vint to the gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 may be connected to the source electrode of the driving thin-film transistor T1 and the drain electrode of the data write thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the display element DPE. The operation control thin-film transistor T5 and the emission control thin-film transistor T6 may be simultaneously turned on in response to an emission control signal En received through the emission control line EL, so that the first power voltage ELVDD may be transmitted to the display element DPE and a driving current may flow in the display element DPE.

A gate electrode of the second initialization thin-film transistor T7 may be connected to the previous scan line SL−1. A source electrode of the second initialization thin-film transistor T7 may be connected to the pixel electrode of the display element DPE. A drain electrode of the second initialization thin-film transistor T7 may be connected to the initialization voltage line VL. The second initialization thin-film transistor T7 may be turned on in response to a previous scan signal Sn−1 received through the previous scan line SL−1 and may be configured to initialize the pixel electrode of the display element DPE.

FIG. 5B illustrates that both of the first initialization thin-film transistor T4 and the second initialization thin-film transistor T7 are connected to the previous scan line SL−1. However, according to another embodiment, the first initialization thin-film transistor T4 and the second initialization thin-film transistor T7 may be connected to the previous scan line SL−1 and a next scan line (not shown), respectively, and the first initialization thin-film transistor T4 and the second initialization thin-film transistor T7 may be driven in response to the previous scan signal Sn−1 and a next scan signal, respectively.

The other electrode of the storage capacitor Cst may be connected to the driving voltage line PL. One electrode of the storage capacitor Cst may be connected to the gate electrode of the driving thin-film transistor T1, the drain electrode of the compensation thin-film transistor T3, and the source electrode of the first initialization thin-film transistor T4.

The opposite electrode (for example, a cathode) of the display element DPE may receive the second power voltage ELVSS. The display element DPE may emit light by receiving the driving current from the driving thin-film transistor T1.

Figure 6:
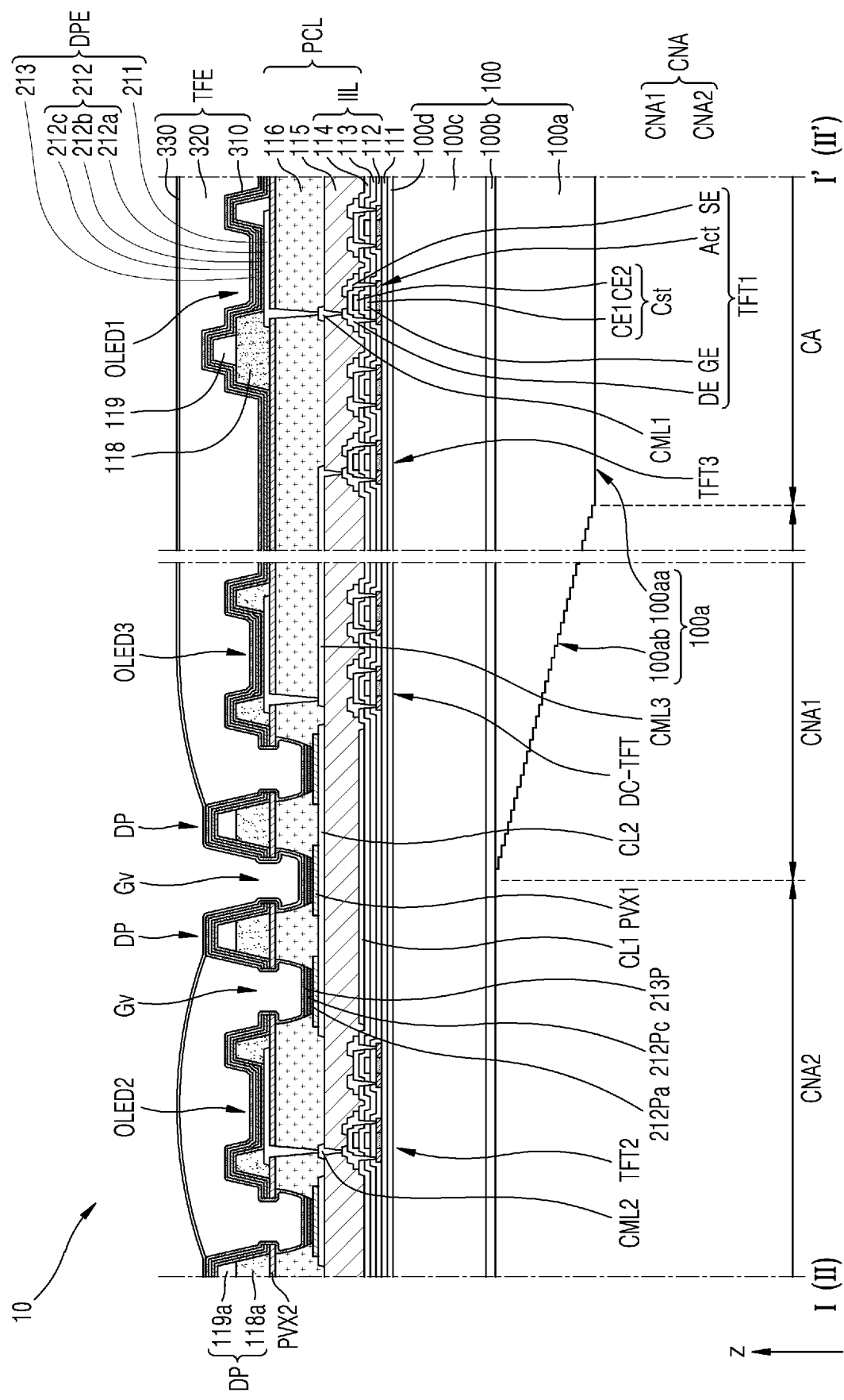
FIG. 6 is a schematic cross-sectional view of a display panel taken along line I-I' or II-II' of FIG. 4B, according to an embodiment.

FIG. 6 is a schematic cross-sectional view of the display panel 10, taken along line I-I' or II-II' of FIG. 4B, according to an embodiment.

Referring to FIG. 6, also referring to FIG. 4B, the display panel 10 may include the substrate 100, a buffer layer 111, a pixel circuit layer PCL, the display element DPE, and a thin-film encapsulation layer TFE. The display panel 10 may include a first thin-film transistor TFT1, and a first organic light-emitting diode OLED1, which is the display element DPE, in the main display area CA. The display panel 10 may include a driving circuit transistor DC-TFT and a third organic light-emitting diode OLED3 in the first corner display area CNA1 and may include a second thin-film transistor TFT2 and a second organic light-emitting diode OLED2 in the second corner display area CNA2.

The substrate 100 may include the main display area CA and the corner display area CNA. The substrate 100 may include the main display area CA, the first corner display area CNA1, and the second corner display area CNA2. The main display area CA illustrated in FIG. 6 may correspond to at least one of the first area A1, the second area A2, and the third area A3.

The substrate 100 may include a first base layer 100a, a first barrier layer 100b, a second base layer 100c, and a second barrier layer 100d. According to an embodiment, the first base layer 100a, the first barrier layer 100b, the second base layer 100c, and the second barrier layer 100d may be sequentially stacked on the substrate 100.

A thickness of the substrate 100 in the corner display area CNA may be less than a thickness of the substrate 100 in the main display area CA. As used herein, the thickness is measured in a thickness direction of the substrate 100, which is z direction. By reducing the thickness of the substrate 100 in the corner display area CNA, the strain of the thin-film encapsulation layer TFE may be reduced. The substrate 100 may approximately have a uniform thickness in at least a portion of the main display area CA. The thickness of the substrate 100 in the corner display area CNA may be reduced away from the main display area CA. The substrate 100 may include a stair portion having a stair shape in the first corner display area CNA1. That is, the thickness of the substrate 100 may gradually decrease in the first corner display area CNA1. When the substrate 100 has the stair shape in the first corner display area CNA1, generation of perforations may be prevented in a manufacturing process.

A thickness of the first base layer 100a in the corner display area CNA may be less than a thickness of the first base layer 100a in the main display area CA. The first base layer 100a may approximately have a uniform thickness in at least a portion of the main display area CA. For example, the first base layer 100a may approximately have the uniform thickness in the first area A1 of the main display area CA. The first base layer 100a may approximately have the uniform thickness in the first area A1, the second area A2, and the third area A3 of the main display area CA. The thickness of the first base layer 100a in the corner display area CNA may decrease away from the main display area CA. The first base layer 100a may include a stair portion having a stair shape in the first corner display area CNA1.

That is, the thickness of the first base layer 100*a* in the first corner display area CNA1 may gradually decrease away from the main display area CA. According to the present embodiment, the first base layer 100*a* is illustrated to have the stair shape in the cross-sectional view taken along line I-I' or but the first base layer 100*a* is not limited thereto. For another example, the first base layer 100*a* may also have a stair shape in the first corner display area CNA1 in a direction perpendicular to line I-I' or a direction perpendicular to line II-II'.

The first base layer 100*a* may extend from the main display area CA to the first corner display area CNA1. The first base layer 100*a* may include a first portion 100*aa* arranged in the main display area CA and a second portion 100*ab* arranged in the first corner display area CNA1. The first base layer 100*a* may not be arranged in the second corner display area CNA2.

According to an embodiment, the second portion 100*ab* of the first base layer 100*a* may have the stair shape in a portion of the first corner display area CNA1 and may have a uniform thickness, rather than the stair shape, in remaining portions of the first corner display area CNA1. For example, the first base layer 100*a* may include the second portion 100*ab* having the stair shape, in a region overlapping the edge area 20P (see FIG. 3B) of the cover window 20 (see FIG. 3B) in a plan view. That is, the first base layer 100*a* may include the second portion 100*ab* having the stair shape in the first partial area CNA1*a* (see FIG. 4B) of the first corner display area CNA1 and having the same or substantially the same thickness as the first portion 100*aa* in the second partial area CNA1*b* (see FIG. 4B).

According to another embodiment, the second portion 100*ab* of the first base layer 100*a* may have a stair shape throughout the first corner display area CNA1. For example, the first base layer 100*a* may include the second portion 100*ab* having the stair shape in the first partial area CNA1*a* (see FIG. 4B) and the second partial area CNA1*b* (see FIG. 4B) of the first corner display area CNA1.

The first portion 100*aa* may approximately have a uniform thickness in at least a portion of the main display area CA. The second portion 100*ab* may have a thickness gradually decreasing away from the main display area CA. The second portion 100*ab* may have the stair shape. A thickness of the first base layer 100*a* may be a height from a rear surface of the first barrier layer 100*b* to a rear surface of the first base layer 100*a* in a direction (e.g., a −z direction) perpendicular to the substrate 100.

At least one of the first base layer 100*a* and the second base layer 100*c* may include polymer resins, such as polyethersulfone, polyarylate, polyetherimide, polyethylene naphthalate, polyethylene terephthalate, polyphenylene sulfide, polyimide, polycarbonate, cellulose tri acetate, or cellulose acetate propionate.

The first barrier layer 100*b* and the second barrier layer 100*d* may prevent the penetration of external impurities and may include a single layer or a plurality of layers including an inorganic material, such as silicon nitride ($SiN_x$), silicon oxide ($SiO_2$), and/or silicon oxynitride (SiON).

The buffer layer 111 may be arranged on the substrate 100. The buffer layer 111 may include an inorganic insulating material, such as $SiN_x$, SiON, and $SiO_2$, and may include a single layer or a plurality of layers including the inorganic insulating materials described above.

The pixel circuit layer PCL may be arranged on the buffer layer 111. The pixel circuit layer PCL may include the first thin-film transistor TFT1 arranged in the main display area CA, the driving circuit transistor DC-TFT arranged in the first corner display area CNA1, the second thin-film transistor TFT2 arranged in the second corner display area CNA2, and a third thin-film transistor TFT3. According to an embodiment, the third thin-film transistor TFT3 connected to the third organic light-emitting diode OLED3 arranged in the first corner display area CNA1 may be arranged around the first corner display area CNA1, for example, in the main display area CA.

The pixel circuit layer PCL may include an inorganic insulating layer IIL, a first planarization layer 115, and a second planarization layer 116 arranged below or/and above the first thin-film transistor TFT1, the second thin-film transistor TFT2, the driving circuit transistor DC-TFT, and components thereof. In the first corner display area CNA1 and the second corner display area CNA2, the pixel circuit layer PCL may include the inorganic insulating layer IIL, a first connection line CL1, the first planarization layer 115, a second connection line CL2, the second planarization layer 116, and an inorganic pattern layer PVX2.

The inorganic insulating layer IIL may include a first gate insulating layer 112, a second gate insulating layer 113, and an interlayer insulating layer 114. The first planarization layer 115 may be arranged on the inorganic insulating layer IIL. The first connection line CL1 may be arranged on the inorganic insulating layer IIL. The first connection line CL1 may extend from the first corner display area CNA1 to the second corner display area CNA2. The first connection line CL1 may be a signal line or a power line configured to provide an electrical signal or power to the pixel in the second corner display area CNA2.

Each of the first thin-film transistor TFT1, the second thin-film transistor TFT2, the third thin-film transistor TFT3, and the driving circuit transistor DC-TFT may include a semiconductor layer Act, a gate electrode GE, a source electrode SE, and a drain electrode DE.

The semiconductor layer Act may include polysilicon. Alternatively, the semiconductor layer Act may include amorphous silicon, an oxide semiconductor, or an organic semiconductor. The semiconductor layer Act may include a channel area, a drain area and a source area arranged at both sides of the channel area, respectively. The gate electrode GE may overlap the channel area in a plan view.

The gate electrode GE may include a low-resistance metal material. The gate electrode GE may include a conductive material including Mo, Al, Cu, Ti, etc. and may include a plurality of layers or a single layer including the conductive materials described above.

The first gate insulating layer 112 between the semiconductor layer Act and the gate electrode GE may include an inorganic insulating material, such as $SiO_2$, $SiN_x$, SiON, $Al_2O_3$, $TiO_2$, $Ta_2O_5$, $HfO_2$, $ZnO_x$ (which can be ZnO or $ZnO_2$), or the like.

The second gate insulating layer 113 may be provided to cover the gate electrode GE. Similar to the first gate insulating layer 112, the second gate insulating layer 113 may include an inorganic insulating material, such as $SiO_2$, $SiN_x$, SiON, $Al_2O_3$, $TiO_2$, $Ta_2O_5$, $HfO_2$, $ZnO_x$ (which can be ZnO or $ZnO_2$), or the like.

An upper electrode CE2 of the storage capacitor Cst may be arranged above the second gate insulating layer 113. The upper electrode CE2 may overlap the gate electrode GE therebelow in a plan view. Here, the gate electrode GE and the upper electrode CE2 overlapping each other with the second gate insulating layer 113 therebetween may be included in the storage capacitor Cst. That is, the gate electrode GE may function as a lower electrode CE1 of the storage capacitor Cst.

As described above, the storage capacitor Cst and the first thin-film transistor TFT1 may overlap each other. According to some embodiments, the storage capacitor Cst may not overlap the first thin-film transistor TFT1 in a plan view.

The upper electrode CE2 may include Al, Pt, Pd, Ag, Mg, Au, Ni, Nd, Ir, Cr, Ca, Mo, Ti, W, and/or Cu and may include a single layer or a plurality of layers including the materials described above.

The interlayer insulating layer 114 may cover the upper electrode CE2. The interlayer insulating layer 114 may include $SiO_2$, $SiN_x$, SiON, $Al_2O_3$, $TiO_2$, $Ta_2O_5$, $HfO_2$, $ZnO_x$ (which can be ZnO or $ZnO_2$), or the like. The interlayer insulating layer 114 may include a single layer or a plurality of layers including the inorganic insulating materials described above.

Each of the drain electrode DE and the source electrode SE may be arranged on the interlayer insulating layer 114. The drain electrode DE and the source electrode SE may include a highly conductive material. The drain electrode DE and the source electrode SE may include a conductive material including Mo, Al, Cu, Ti, etc. and may include a plurality of layers or a single layer including the materials described above. According to an embodiment, the drain electrode DE and the source electrode SE may have a multi-layered structure of Ti/Al/Ti.

The first planarization layer 115 may be arranged to cover the drain electrode DE and the source electrode SE. The first planarization layer 115 may include an organic insulating layer. The first planarization layer 115 may include an organic insulating material, such as a general-purpose polymer such as polymethylmethacrylate ("PMMA") or polystyrene ("PS"), a polymer derivative having a phenol-based group, an acrylic-based polymer, an imide-based polymer, an aryl ether-based polymer, an amide-based polymer, a fluorine-based polymer, a p-xylene-based polymer, a vinyl alcohol-based polymer, and a blend thereof.

A first connection electrode CML1, the second connection line CL2, a second connection electrode CML2, and a third connection electrode CML3 may be arranged on the first planarization layer 115. According to some embodiments, the second connection electrode CML2 may be included in the second connection line CL2. According to some embodiments, the third connection electrode CML3 may be included in the second connection line CL2.

The first connection electrode CML1 may be connected to the drain electrode DE or the source electrode SE of the first thin-film transistor TFT1 through a contact hole of the first planarization layer 115. The second connection electrode CML2 may be connected to the drain electrode DE or the source electrode SE of the second thin-film transistor TFT2 through the contact hole of the first planarization layer 115.

The second connection line CL2 may extend from the first corner display area CNA1 to the second corner display area CNA2. Similar to the first connection line CL1, the second connection line CL2 may be a signal line or a power line configured to provide an electrical signal or power to the second thin-film transistor TFT2 in the second corner display area CNA2.

According to an embodiment, a lower inorganic pattern layer PVX1 may be arranged on the second connection line CL2. According to an embodiment, the lower inorganic pattern layer PVX1 may be arranged on the second connection line CL2 in a multiple number, and the plurality of lower inorganic pattern layers PVX1 may be arranged on the second connection line CL2 to be apart from each other.

The first connection electrode CML1, the second connection line CL2, the second connection electrode CML2, and the third connection electrode CML3 may include highly conductive materials. The first connection electrode CML1, the second connection line CL2, the second connection electrode CML2, and the third connection electrode CML3 may include a conductive material including Mo, Al, Cu, Ti, or the like and may include a plurality of layers or a single layer including the materials described above. According to an embodiment, the first connection electrode CML1 may have a multi-layered structure of Ti/Al/Ti.

The second planarization layer 116 may be arranged to cover the first connection electrode CML1, the second connection line CL2, the second connection electrode CML2, and the third connection electrode CML3. The second planarization layer 116 may include an organic insulating layer. The second planarization layer 116 may include an organic insulating material, such as a general-purpose polymer such as PMMA or PS, a polymer derivative having a phenol-based group, an acrylic-based polymer, an imide-based polymer, an aryl ether-based polymer, an amide-based polymer, a fluorine-based polymer, a p-xylene-based polymer, a vinyl alcohol-based polymer, and a blend thereof.

An inorganic pattern layer PVX2 may be arranged on the second planarization layer 116. The second planarization layer 116 may be a lower layer defining a groove Gv. The second planarization layer 116 may cover an edge of the lower inorganic pattern layer PVX1. A first functional layer pattern 212Pa, a second functional layer pattern 212Pc, and an opposite electrode pattern 213P may be arranged in the groove Gv.

According to the present embodiment, an upper portion of the inorganic pattern layer PVX2 may include a dam portion DP projecting in a thickness direction of the substrate 100. Also, according to an embodiment, the dam portion DP and the groove Gv may be alternately arranged. The dam portion DP may include a first layer 118a and a second layer 119a. In this case, the first layer 118a of the dam portion DP may include the same material as a pixel-defining layer 118. Also, the first layer 118a may be simultaneously formed with the pixel-defining layer 118. The second layer 119a may include the same material as a spacer 119. Also, the second layer 119a may be simultaneously formed with the spacer 119. The dam portion DP may be arranged at a boundary area of the first corner display area CNA1 and the second corner display area CNA2.

The display element DPE may be arranged on the pixel circuit layer PCL. The display element DPE may include the first organic light-emitting diode OLED1 electrically connected to the first thin-film transistor TFT1, the second organic light-emitting diode OLED2 electrically connected to the second thin-film transistor TFT2, and the third organic light-emitting diode OLED3 electrically connected to the third thin-film transistor TFT3. A pixel electrode 211 of the first organic light-emitting diode OLED1, the second organic light-emitting diode OLED2, and the third organic light-emitting diode OLED3 may be electrically connected to the first connection electrode CML1, second connection electrode CML2 and third connection electrode CML3 respectively through a contact hole of the second planarization layer 116. A driving circuit or a power line may be arranged in the first corner display area CNA1, and the third organic light-emitting diode OLED3 may be arranged to overlap the driving circuit or the power line. The third organic light-emitting diode OLED3 may overlap the driving circuit transistor DC-TFT included in the driving circuit in a plan view.

The pixel electrode 211 may include conductive oxide, such as indium tin oxide ("ITO"), indium zinc oxide ("IZO"), zinc oxide ("ZnO"), indium oxide ("$In_2O_3$"), indium gallium oxide ("IGO"), or aluminum zinc oxide ("AZO"). According to another embodiment, the pixel electrode 211 may include a reflective layer including Ag, Mg, Al, Pt, Pd, Au, Ni, Nd, Ir, Cr, or a compound thereof. According to another embodiment, the pixel electrode 211 may further include a layer including ITO, IZO, ZnO, or $In_2O_3$ above/below the reflective layer described above.

The pixel-defining layer 118 having an opening exposing a central portion of the pixel electrode 211 may be arranged on the pixel electrode 211. The pixel-defining layer 118 may include an organic insulating material and/or an inorganic insulating material. The opening may define an emission area (hereinafter, referred to as an emission area) of the light emitted from the first organic light-emitting diode OLED1.

The spacer 119 may be arranged on the pixel-defining layer 118. The spacer 119 may be provided to prevent fracture of the substrate 100 when a display apparatus is manufactured. In a manufacturing process of the display apparatus, a mask sheet may be used. Here, the mask sheet may be inserted into the opening of the pixel-defining layer 118 or may adhere to the pixel-defining layer 118, and thus, damage to or a fracture of a portion of the substrate 100, caused by the mask sheet when a deposition material is deposited on the substrate 100, may be prevented.

The spacer 119 may include an organic insulating material, such as polyimide. Alternatively, the spacer 119 may include an inorganic insulating material, such as $SiN_x$ or $SiO_2$, or may include an organic insulating material and an inorganic insulating material.

According to an embodiment, the spacer 119 may include a different material from the pixel-defining layer 118. Alternatively, according to another embodiment, the spacer 119 may include the same material as the pixel-defining layer 118, and in this case, the pixel-defining layer 118 and the spacer 119 may be formed together by a mask process using a halftone mask, etc.

An intermediate layer 212 may be arranged on the pixel-defining layer 118. The intermediate layer 212 may include an emission layer 212b arranged in the opening of the pixel-defining layer 118. The emission layer 212b may include a high molecular-weight or low molecular-weight organic material emitting a predetermined color of light.

A first functional layer 212a and a second functional layer 212c may be arranged above and below the emission layer 212b, respectively. The first functional layer 212a may include, for example, a hole transport layer ("HTL"), or an HTL and a hole injection layer ("HIL"). The second functional layer 212c may be arranged above the emission layer 212b and may be optionally arranged. The second functional layer 212c may include an electron transport layer ("ETL") and/or an electron injection layer ("EIL"). The first functional layer 212a and/or the second functional layer 212c may be a common layer formed to entirely cover the substrate 100, like an opposite electrode 213 to be described below.

The opposite electrode 213 may include a conductive material having a low work function. For example, the opposite electrode 213 may include a (semi) transparent layer including Ag, Mg, Al, Pt, Pd, Au, Ni, Nd, Ir, Cr, Li, Ca, or an alloy thereof. Alternatively, the opposite electrode 213 may further include a layer including ITO, IZO, ZnO, or $In_2O_3$ on the (semi) transparent layer including the materials described above.

According to some embodiments, a capping layer (not shown) may further be arranged on the opposite electrode 213. The capping layer may include LiF, an inorganic material, or/and an organic material.

The thin-film encapsulation layer TFE may be arranged on the opposite electrode 213. According to an embodiment, the thin-film encapsulation layer TFE may include at least one inorganic encapsulation layer and at least one organic encapsulation layer. According to an embodiment, FIG. 6 illustrates that the thin-film encapsulation layer TFE may include a first inorganic encapsulation layer 310, an organic encapsulation layer 320, and a second inorganic encapsulation layer 330 that are sequentially stacked. The thin-film encapsulation layer TFE may cover the first organic light-emitting diode OLED1, the second organic light-emitting diode OLED2, and the third organic light-emitting diode OLED3.

The first inorganic encapsulation layer 310 and the second inorganic encapsulation layer 330 may include at least one inorganic material from among aluminum oxide, titanium oxide, tantalum oxide, hafnium oxide, ZnO (which can be ZnO or $ZnO_2$), $SiO_x$ (e.g., $SiO_2$), $SiN_x$, and SiON. The organic encapsulation layer 320 may include a polymer-based material. The polymer-based material may include acrylic-based resins, epoxy-based resins, polyimide, polyethylene, etc. According to an embodiment, the organic encapsulation layer 320 may include acrylate.

Although not shown, a touch electrode layer may be arranged on the thin-film encapsulation layer TFE, and an optical functional layer may be arranged on the touch electrode layer. The touch electrode layer may obtain coordinate information based on an external input, for example, a touch event. The optical functional layer may reduce a reflectivity of light (external light) incident toward a display apparatus from the outside and/or may improve a color purity of light emitted from the display apparatus. According to an embodiment, the optical functional layer may include a phase retarder and a polarizer. The phase retarder may include a film-type phase retarder or a liquid crystal coating-type phase retarder, and may include a $\lambda/2$ phase retarder and/or a $\lambda/4$ phase retarder. The polarizer may also include a film-type polarizer or a liquid crystal coating-type polarizer. The film-type polarizer may include an elongation-type synthetic resin film, and the liquid crystal coating-type polarizer may include liquid crystals arranged in a certain shape. The phase retarder and the polarizer may further include a protective film.

According to another embodiment, the optical functional layer may include a black matrix and color filters. The color filters may be arranged by taking into account a color of light emitted from each of pixels of the display apparatus. Each of the color filters may include a red, green, or blue pigment or dye. Alternatively, each of the color filters may further include quantum dots, in addition to the pigment or the dye described above. Alternatively, some of the color filters may not include the pigment or the dye described above and may include scattered particles, such as oxide titanium.

According to another embodiment, the optical functional layer may include a destructive interference structure. The destructive interference structure may include a first reflective layer and a second reflective layer arranged on different layers from each other. First reflective light and second reflective light reflected from the first reflective layer and the second reflective layer, respectively, may destructively interfere, and thus, the reflectivity of external light may be decreased.

An adhesion member may be arranged between the touch electrode layer and the optical functional layer. The adhesion member may not be limited to particular types and may be implemented as general members known in the art. The adhesion member may include a pressure sensitive adhesive ("PSA").

A concave groove Gv may be provided on the substrate 100 in a thickness direction (i.e., z direction) of the substrate 100. In this case, the groove Gv may be arranged between the second organic light-emitting diode OLED2 and the third organic light-emitting diode OLED3.

Reference numerals indicated with respect to descriptions given hereinafter, the reference numerals being the same as the reference numerals of FIG. 6, denote the same members as the members illustrated in FIG. 6 or members corresponding to the members illustrated in FIG. 6, and thus, their descriptions are omitted for convenience of explanation.

Figure 7:
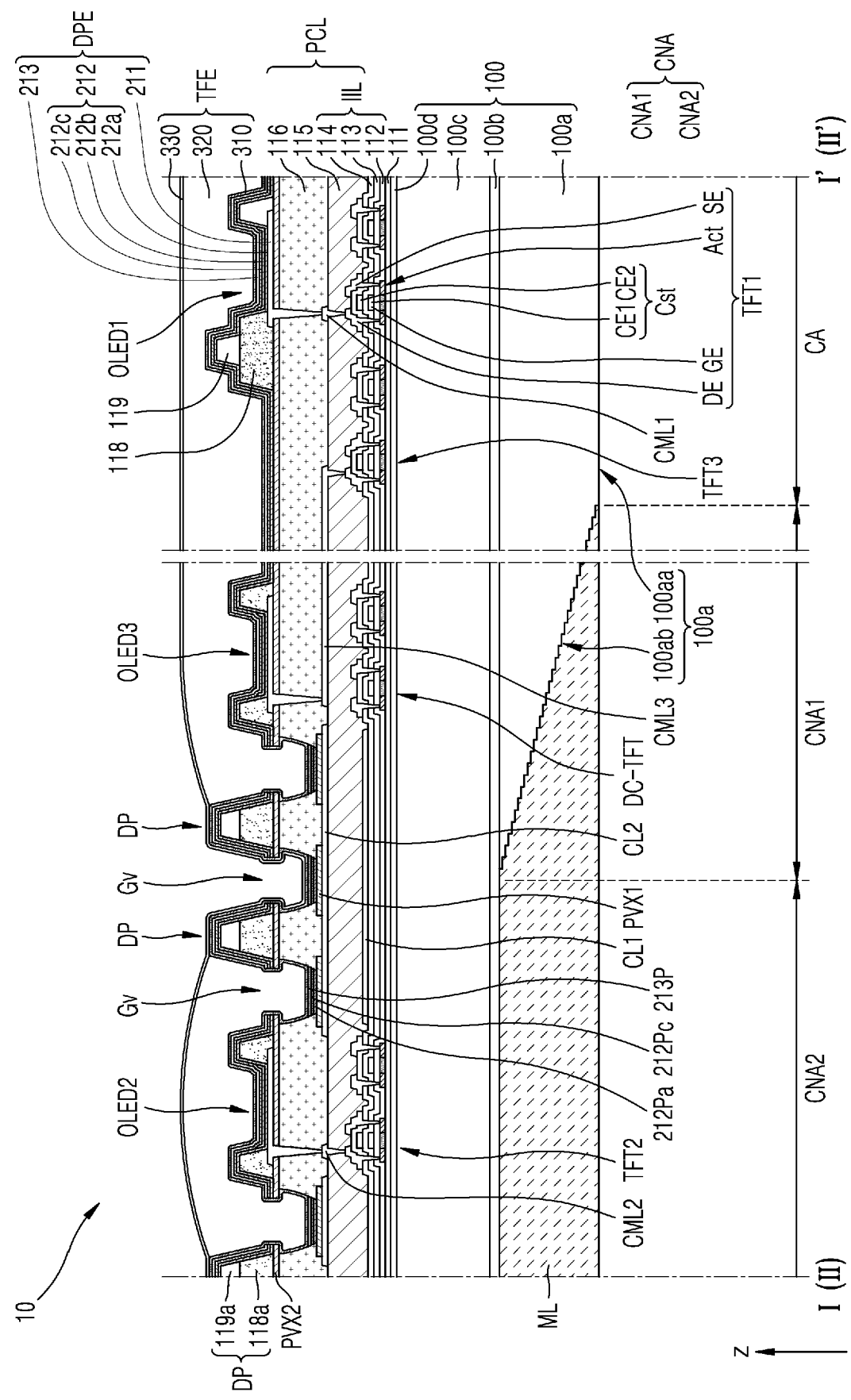
FIG. 7 is a schematic cross-sectional view of a display panel taken along line I-I' or II-II' of FIG. 4B, according to another embodiment.

FIG. 7 is a schematic cross-sectional view of the display panel 10, taken along line I-I' or II-II' of FIG. 4B, according to another embodiment.

Referring to FIG. 7, the display panel 10 may further include a material layer ML.

The material layer ML may be arranged in the corner display area CNA. The material layer ML may be arranged below the substrate 100. The substrate 100 may be arranged on the material layer ML. The first base layer 100a and the first barrier layer 100b may be arranged on the material layer ML. A thickness of the material layer ML may be a height from a rear surface of the material layer ML to a rear surface of the first barrier layer 100b in a direction (e.g., a z direction) perpendicular to the substrate 100.

The material layer ML and the first base layer 100a may overlap each other in the first corner display area CNA1. That is, the material layer ML may overlap the second portion 100ab of the first base layer 100a in the first corner display area CNA1 in a plan view. The material layer ML may have a stair shape in the first corner display area CNA1. The stair shape of the material layer ML in the first corner display area CNA1 may interlock with the stair shape of the second portion 100ab of the first base layer 100a in the first corner display area CNA1.

The thickness of the material layer ML in the first corner display area CNA1 may increase away from the main display area CA. The thickness of the material layer ML in the second corner display area CNA2 may be substantially uniform. The thickness of the material layer ML in the second corner display area CNA2 may be substantially the same as the thickness of the first base layer 100a in the main display area CA, but it is not limited thereto. A sum of the thicknesses of the material layer ML and the second portion 100ab of the first base layer 100a in the direction perpendicular to the substrate 100 in the first corner display area CNA1 may be substantially the same as each of the thickness of the material layer ML in the second corner display area CNA2 and the thickness of the first base layer 100a in the main display area CA.

A front surface of the material layer ML in the second corner display area CNA2 may directly contact the rear surface of the first barrier layer 100b. A front surface of the material layer ML in the first corner display area CNA1 may directly contact a rear surface of the second portion 100ab of the first base layer 100a.

The material layer ML may include a different material from the substrate 100. The material layer ML may have a lower modulus than the substrate 100. The material layer ML may have a lower modulus than the first base layer 100a. The material layer ML may have a lower modulus than the second base layer 100c. The modulus of the first base layer 100a and the modulus of the second base layer 100c may be substantially the same as each other, but it is not limited thereto. For another example, the first base layer 100a may have a different modulus from the second base layer 100c. By forming the material layer ML having the lower modulus than the substrate 100, below the substrate 100 in the corner display area CNA having a relatively small thickness, the strain of the thin-film encapsulation layer TFE may be reduced. The material layer ML may include, for example, an OCA, resins, etc.

Figure 8:
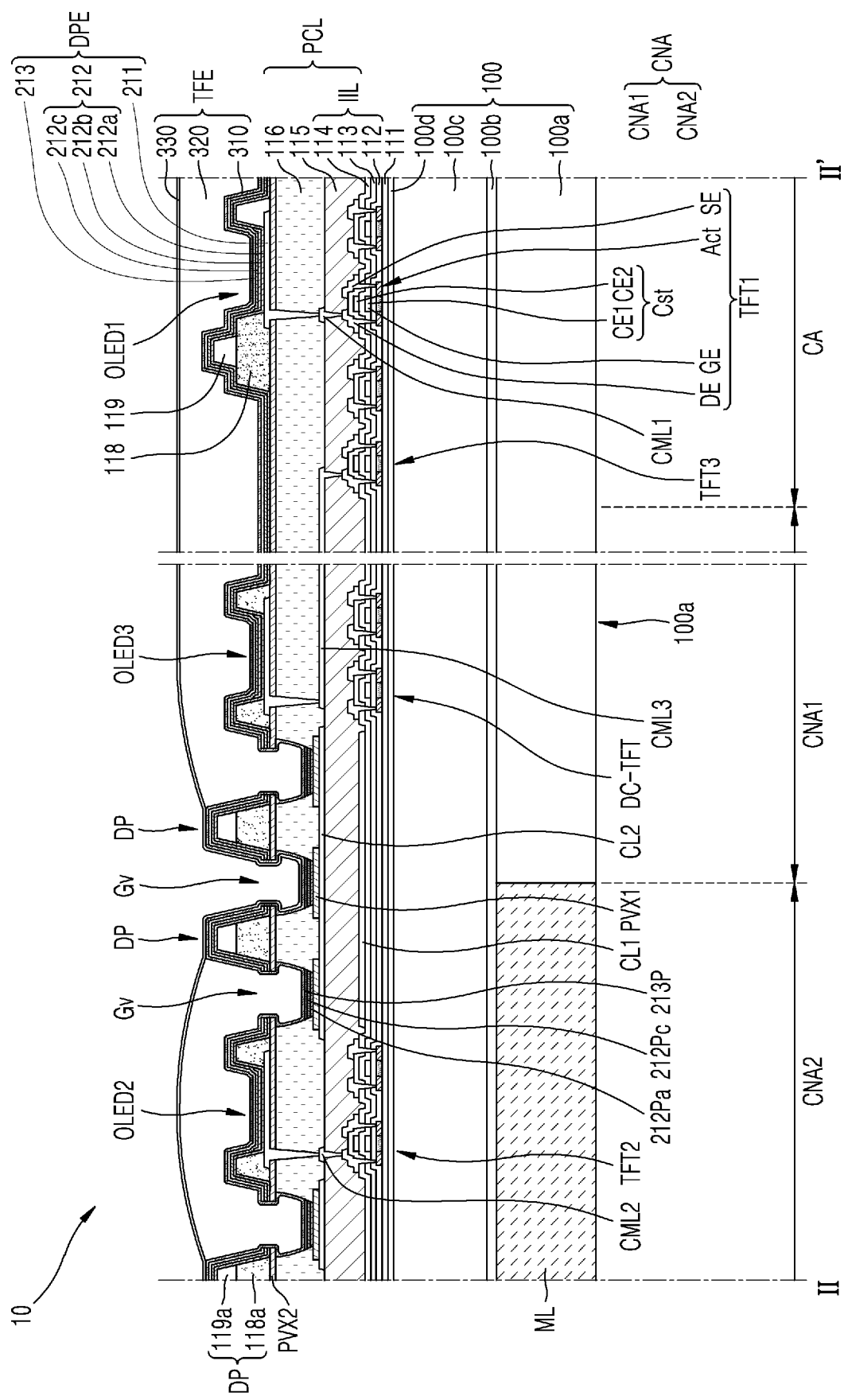
FIG. 8 is a schematic cross-sectional view of a display panel taken along line II-II' of FIG. 4B, according to still another embodiment.

FIG. 8 is a schematic cross-sectional view of the display panel 10, taken along line II-II' of FIG. 4B, according to still another embodiment.

Referring to FIG. 8, the cross-sectional view of the present embodiment illustrates another embodiment of a region overlapping the central area 20M of the cover window 20 described with reference to FIGS. 3A and 3B in a plan view.

According to the present embodiment, the substrate 100 may not include a stair shape in a portion of the first corner display area CNA1. The first base layer 100a may not include a stair shape in a portion of the first corner display area CNA1. According to the present embodiment, the first base layer 100a may not include a stair shape in the region overlapping the central area 20M of the cover window 20 described with reference to FIGS. 3A and 3B. That is, the first base layer 100a may not include the stair shape in the second partial area CNA1b of the first corner display area CNA1 described with reference to FIG. 4B.

According to the present embodiment, the substrate 100 may have substantially the same thickness as the material layer ML in a portion of the first corner display area CNA1. The substrate 100 may approximately have a uniform thickness in the second partial area CNA1b (see FIG. 4B) of the first corner display area CNA1. The thickness of the substrate 100 in the second partial area CNA1b (see FIG. 4B) of the first corner display area CNA1 may be substantially the same as a thickness of the substrate 100 in the main display area CA. Also in this case, a thickness of the substrate 100 in the second corner display area CNA2 may be smaller than each of the thickness of the substrate 100 in the first corner display area CNA1 and the thickness of the substrate 100 in the main display area CA.

According to the present embodiment, the first base layer 100a may have substantially the same thickness as the material layer ML in a portion of the first corner display area CNA1. The first base layer 100a may approximately have a uniform thickness in the second partial area CNA1b (see FIG. 4B) of the first corner display area CNA1. The thickness of the first base layer 100a in the second partial area CNA1b (see FIG. 4B) of the first corner display area CNA1 may be substantially the same as a thickness of the first base layer 100a in the main display area CA. In this case, the material layer ML may overlap the second corner display area CNA2 and may not overlap the first corner display area CNA1 in a plan view. Also, the first base layer 100a may have a stair shape in the first corner display area CNA1, in a direction perpendicular to line II-II'.

Figure 9:
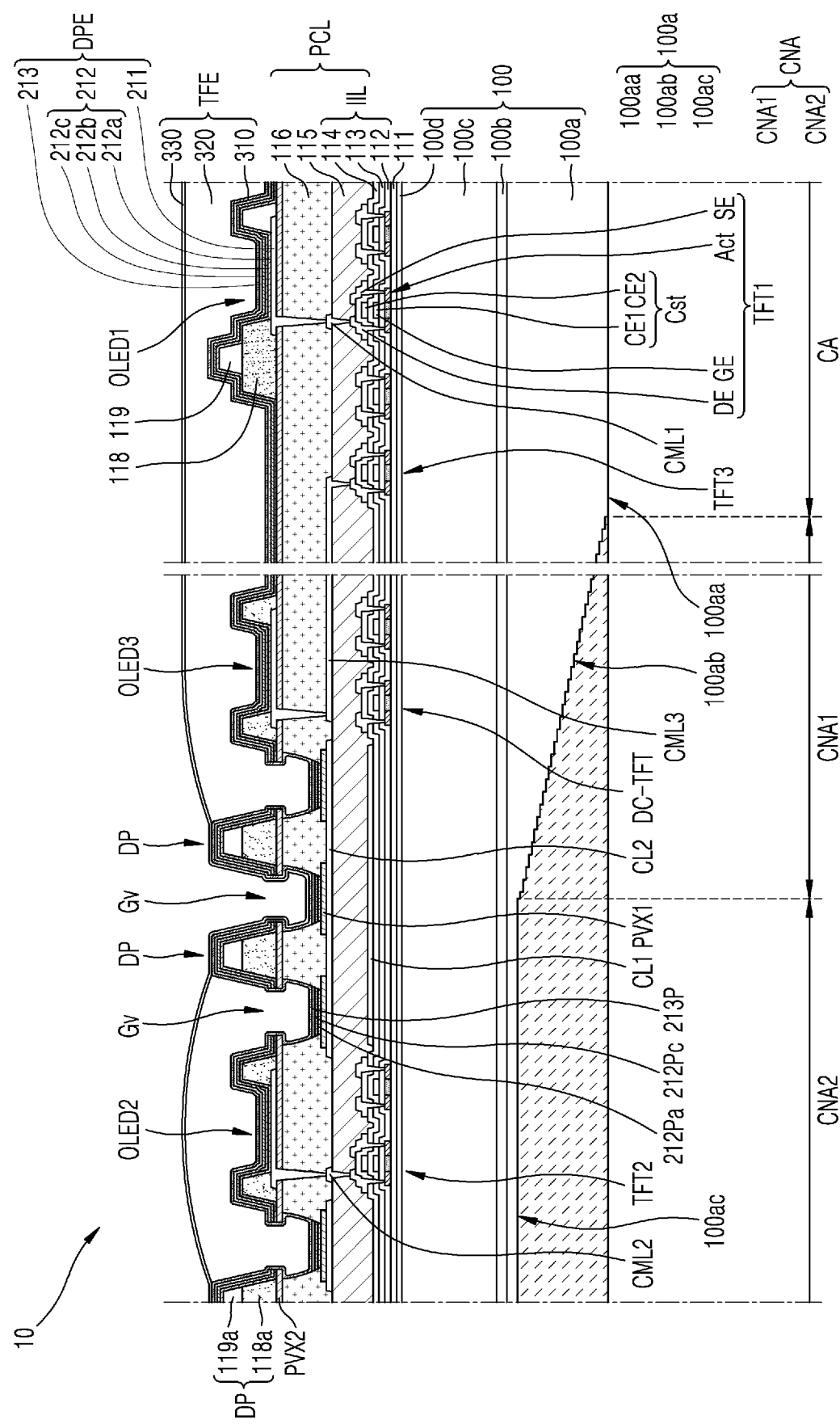
FIG. 9 is a schematic cross-sectional view of a display panel taken along line I-I' or II-II' of FIG. 4B, according to yet another embodiment.

FIG. 9 is a schematic cross-sectional view of the display panel 10, taken along line I-I' or II-II' of FIG. 4B, according to yet another embodiment.

Referring to FIG. 9, the first base layer 100a may include a first portion 100aa arranged in the main display area CA, a second portion 100ab arranged in the first corner display area CNA1, and a third portion 100ac arranged in the second corner display area CNA2. The third portion 100ac may extend from the second portion 100*ab* to the second corner display area CNA2. The third portion 100*ac* may be arranged on a rear surface of the first barrier layer 100*b*. The second portion 100*ab* and the third portion 100*ac* may be arranged between the material layer ML and the first barrier layer 100*b*. The third portion 100*ac* may have a smaller thickness than each of the first portion 100*aa* and the second portion 100*ab*. The second portion 100*ab* may have a stair shape, and the third portion 100*ac* may have a substantially uniform thickness.

Figure 10A:
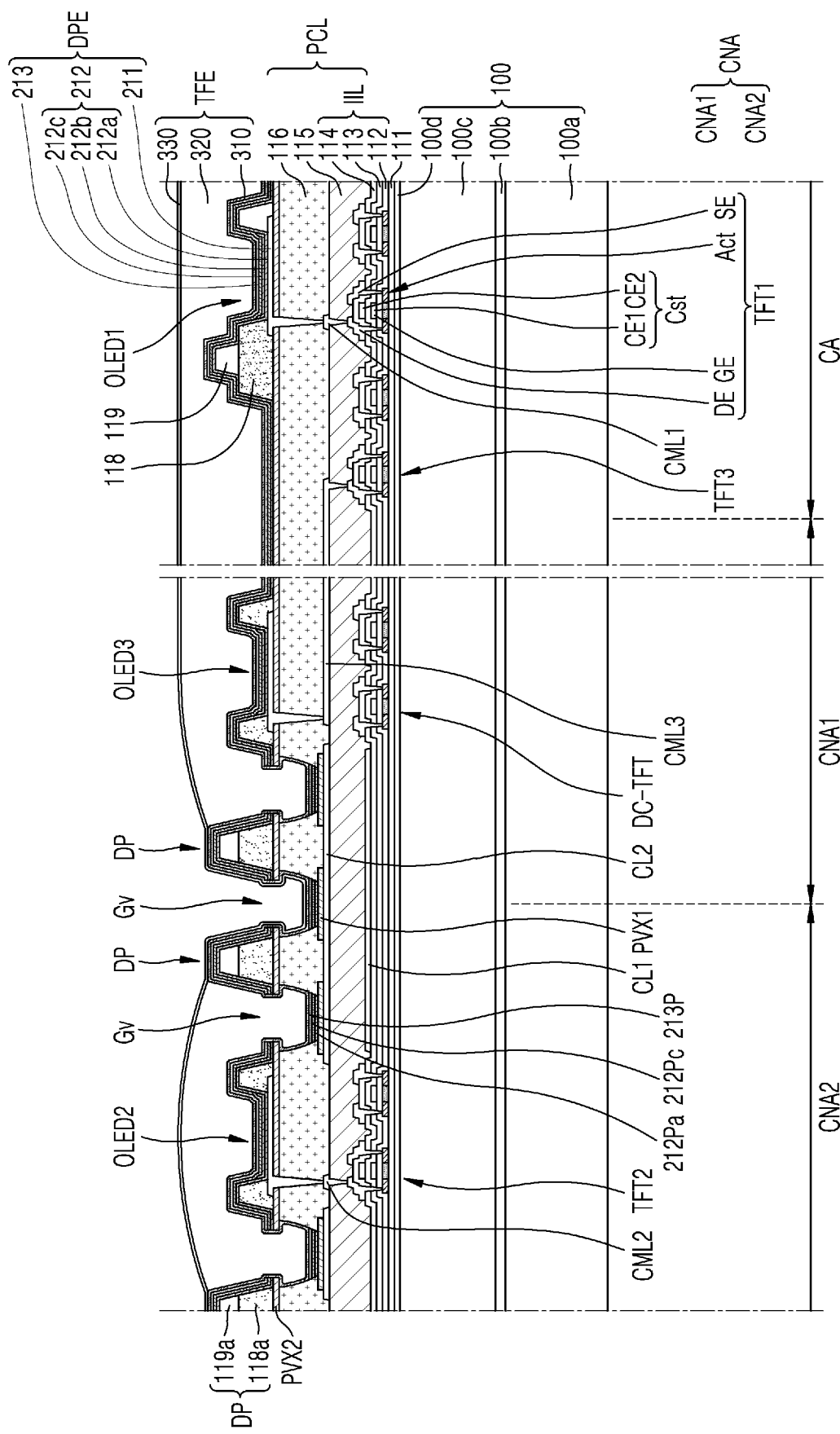
FIGS. 10A to 10C are cross-sectional views for describing a method of manufacturing a display apparatus, according to an embodiment.
Figure 10B:
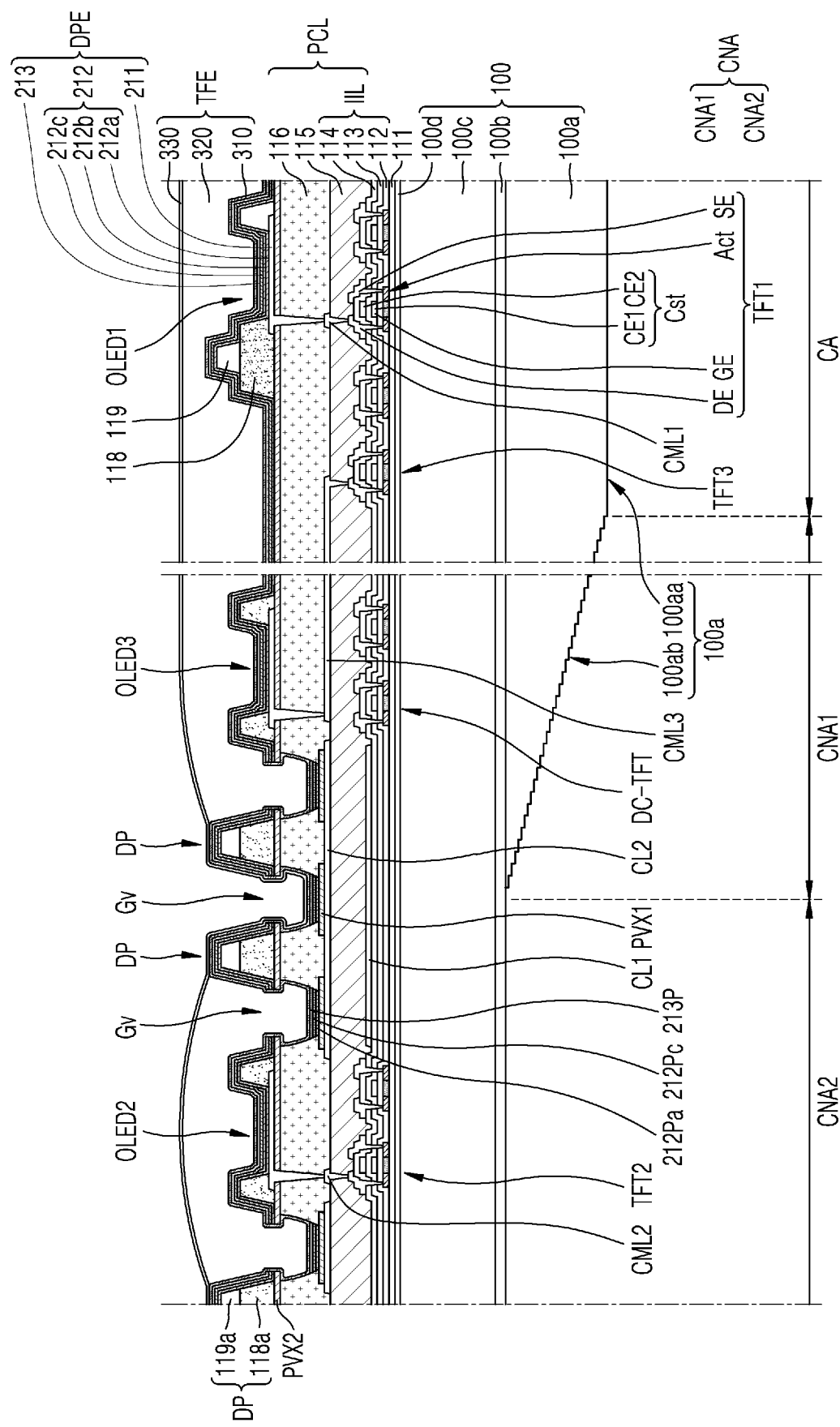
Figure 10C:
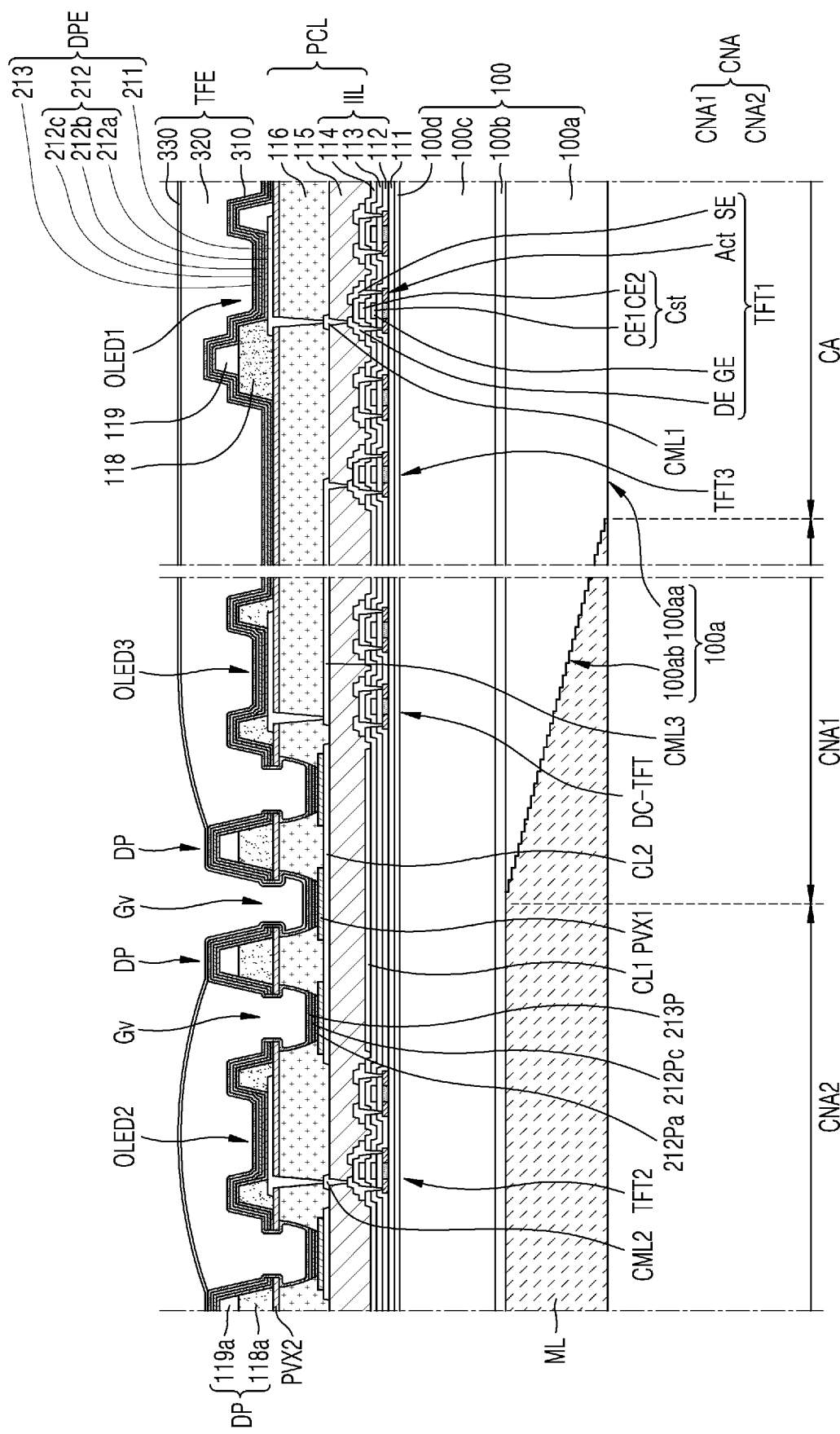

FIGS. 10A to 10C are cross-sectional views for describing a method of manufacturing a display apparatus, according to an embodiment.

Referring to FIG. 10A, the substrate 100 may be formed on carrier glass. The first base layer 100*a*, the first barrier layer 100*b*, the second base layer 100*c*, and the second barrier layer 100*d* may be sequentially formed on the carrier glass. Next, the buffer layer 111, the pixel circuit layer PCL, the display element DPE, and the thin-film encapsulation layer TFE may be formed on the substrate 100. Next, the carrier glass may be detached from the first base layer 100*a*.

Referring to FIG. 10B, a portion of the substrate 100 may be removed. In detail, a portion of the first base layer 100*a* may be removed. The first base layer 100*a* in the corner display area CNA may be removed. The substrate 100 may be formed to have a small thickness in the corner display area CNA, which is vulnerable to stress, and thus, the strain of the thin-film encapsulation layer TFE may be reduced.

According to an embodiment, the first base layer 100*a* in the second corner display area CNA2 may be completely removed, and the first base layer 100*a* in the first corner display area CNA1 may be removed such that the first base layer 100*a* may have a gradually decreasing thickness. According to another embodiment, the first base layer 100*a* in the second corner display area CNA2 may partially remain, as illustrated in FIG. 9. In the first corner display area CNA1, the first base layer 100*a* may be partially removed so as to have a stair shape, and thus, generation of perforations, which may occur in a subsequent manufacturing process, may be prevented.

The first base layer 100*a* may be removed by, for example, laser drilling, laser etching, or the like. The stair shape of the first base layer 100*a* may be formed by adjusting the intensity of laser drilling or laser etching or controlling the number of processing times.

Referring to FIG. 10C, the material layer ML may be formed on the first base layer 100*a* partially removed. The material layer ML may include a material having a lower modulus than the substrate 100. The material layer ML may include a material having a lower modulus than each of the first base layer 100*a* and the second base layer 100*c*. The material layer ML may include, for example, materials, such as an OCA, resins, etc.

As described above, according to the one or more of the above embodiments, a thickness of a substrate may be reduced in a corner display area (in particular, a portion of the corner display area, the portion corresponding to a curved area of a cover window), and thus, the strain of a thin-film encapsulation layer may be reduced. According to an embodiment, on the substrate, a first base layer may be removed in a second corner display area CNA2, and the first base layer may be gradually removed in a first corner display area so as to have a stair shape. According to an embodiment, a material layer (an OCA or resins) having a relatively low modulus may be arranged on a portion of the substrate, from which the first base layer is removed.

According to an embodiment, a stress occurring in a corner area may be reduced, and thus, a display panel and a display apparatus having increased reliability may be realized. However, the scope of the disclosure is not limited to this effect as described above.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
a substrate comprising a main display area and a corner display area extending from a corner of the main display area; and
a plurality of pixels arranged in the main display area and the corner display area,
wherein the substrate further comprises:
a first base layer;
a first barrier layer arranged on the first base layer; and
a second base layer arranged on the first barrier layer,
wherein a thickness of the substrate in the corner display area decreases away from the main display area.

2. The display panel of claim 1, wherein a thickness of the first base layer in the corner display area decreases away from the main display area.

3. The display panel of claim 1, wherein the substrate has a stair shape in the corner display area.

4. The display panel of claim 1, wherein the corner display area comprises a first corner display area adjacent to the main display area and a second corner display area extending from the first corner display area,
wherein a driving circuit is arranged in the first corner display area, and
a plurality of extension areas is arranged in the second corner display area.

5. The display panel of claim 4, wherein the first base layer comprises a first portion arranged in the main display area and a second portion arranged in the first corner display area,
wherein a thickness of the second portion decreases away from the main display area.

6. The display panel of claim 5, wherein the second portion has a stair shape.

7. The display panel of claim 5, wherein the first base layer further comprises a third portion arranged in the second corner display area.

8. The display panel of claim 7, wherein a thickness of the third portion is smaller than the thickness of the second portion.

9. The display panel of claim 4, wherein the first base layer has a stair shape in a portion of the first corner display area, and the portion overlaps a curved area of a cover window.

10. The display panel of claim 4, wherein some of a plurality of corner pixels arranged in the first corner display area of the plurality of pixels at least partially overlap the driving circuit.

11. The display panel of claim 1, further comprising a material layer arranged in the corner display area and arranged below the substrate.

12. The display panel of claim 11, wherein the material layer has a lower modulus than the first base layer.

13. A display panel comprising:
a substrate comprising a main display area and a corner display area extending from a corner of the main display area;
a material layer arranged in the corner display area and arranged below the substrate; and
a plurality of pixels arranged in the main display area and the corner display area,
wherein the substrate further comprises:
a first base layer arranged at least in the main display area and comprising a different material from the material layer;
a first barrier layer arranged on the first base layer and the material layer; and
a second base layer arranged on the first barrier layer,
wherein the material layer has a lower modulus than the first base layer.

14. The display panel of claim 13, wherein at least a portion of the first base layer is arranged in the corner display area, and a thickness of the at least the portion of the first base layer in the corner display area decreases away from the main display area.

15. The display panel of claim 13, wherein the first base layer has a stair shape in the corner display area.

16. The display panel of claim 13, wherein the corner display area comprises a first corner display area adjacent to the main display area and a second corner display area extending from the first corner display area,
wherein a driving circuit is arranged in the first corner display area,
a plurality of extension areas is arranged in the second corner display area, and
the material layer overlaps the first base layer in the first corner display area.

17. A display apparatus comprising:
a display panel; and
a cover window arranged on the display panel,
wherein the display panel comprises:
a substrate comprising a main display area and a corner display area extending from a corner of the main display area; and
a plurality of pixels arranged in the main display area and the corner display area,
wherein the substrate further comprises:
a first base layer;
a first barrier layer arranged on the first base layer; and
a second base layer arranged on the first barrier layer,
wherein a thickness of the substrate decreases away from the main display area.

18. The display apparatus of claim 17, wherein the first base layer comprises a first portion arranged in the main display area and a second portion arranged in the corner display area, and the second portion has a stair shape.

19. The display apparatus of claim 18, wherein the corner display area comprises a first corner display area adjacent to the main display area and a second corner display area extending from the first corner display area,
wherein a driving circuit and the second portion of the first base layer are arranged in the first corner display area, and
a plurality of extension areas is arranged in the second corner display area.

20. The display apparatus of claim 19, wherein the cover window comprises a central area and an edge area arranged outside the central area,
the edge area has a curved surface,
the first corner display area comprises a first partial area overlapping the edge area of the cover window and a second partial area overlapping the central area, and
the second portion of the first base layer is arranged to correspond to the first partial area.

* * * * *